(12) United States Patent
Miura et al.

(10) Patent No.: US 6,703,909 B2
(45) Date of Patent: Mar. 9, 2004

(54) COVERING SHEET, TRIPLATE LINE USING THE SHEET, SIGNAL BUS FOR COMPUTER USING THE SHEET AND COVERING STRUCTURE OF ELECTRONIC CIRCUIT USING THE SHEET

(75) Inventors: Taro Miura, Tokyo (JP); Yoshikazu Fujishiro, Tokyo (JP)

(73) Assignee: TDK Corporation, Tokyo (JP)

( * ) Notice: Subject to any disclaimer, the term of this patent is extended or adjusted under 35 U.S.C. 154(b) by 84 days.

(21) Appl. No.: 09/991,648

(22) Filed: Nov. 26, 2001

(65) Prior Publication Data

US 2002/0127924 A1 Sep. 12, 2002

(30) Foreign Application Priority Data

Nov. 28, 2000 (JP) ......................................... 2000-361315

(51) Int. Cl.$^7$ ................................................. H01P 3/08
(52) U.S. Cl. ........................ 333/128; 361/794; 361/795
(58) Field of Search ................................. 333/128, 246; 361/794, 795; 428/422, 116, 117, 118

(56) References Cited

U.S. PATENT DOCUMENTS

| | | | | |
|---|---|---|---|---|
| 5,149,590 A | * | 9/1992 | Arthur et al. ................ 428/421 |
| 5,574,630 A | * | 11/1996 | Kresge et al. .............. 361/792 |
| 5,590,030 A | * | 12/1996 | Kametani et al. ........... 361/794 |
| 5,652,055 A | * | 7/1997 | King et al. .................. 428/343 |
| 5,830,548 A | * | 11/1998 | Andersen et al. ........... 428/36.4 |
| 6,002,593 A | * | 12/1999 | Tohya et al. ................. 361/765 |
| 6,075,211 A | * | 6/2000 | Tohya et al. ................. 174/255 |
| 6,448,650 B1 | * | 9/2002 | Saran et al. ................. 257/758 |

OTHER PUBLICATIONS

Chen et al., "Microstructural origin of soft magnetic properties of sendust films prepared by N2 reactive sputtering", Jul. 1998, Journal of Applied Physics—vol. 84 No. 2, Fig. 1.*

* cited by examiner

*Primary Examiner*—Robert Pascal
*Assistant Examiner*—Dean Takaoka
(74) *Attorney, Agent, or Firm*—Oblon, Spivak, McClelland, Maier & Neustadt, P.C.

(57) ABSTRACT

The covering sheet includes at least one magnetic material layer made of a resin compound having an oxide magnetic material or a metal magnetic material mixed therein, a ground conductor layer laminated on one surface of the magnetic material layer, and a plurality of via holes for passing conducting unit for grounding the ground conductor layer, or includes a laminate consisting of at least one magnetic material layer made of a resin compound having an oxide magnetic material or a metal magnetic material mixed therein and at least one dielectric layer having a permittivity lower than that of the magnetic material layer, and a ground conductor layer laminated on one surface of the laminate.

22 Claims, 25 Drawing Sheets

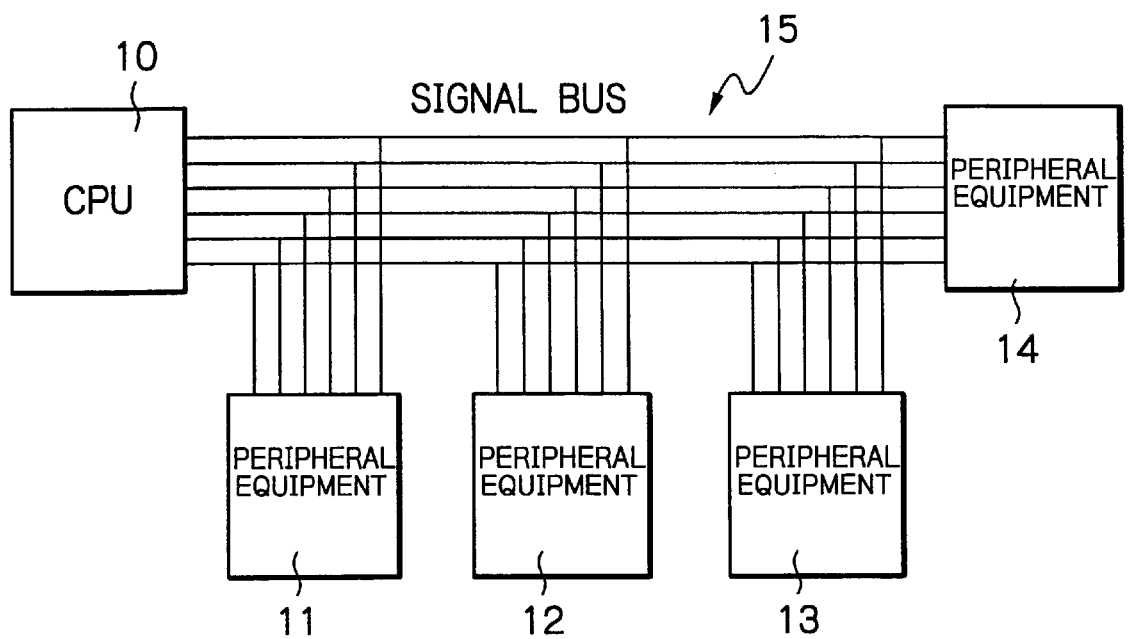
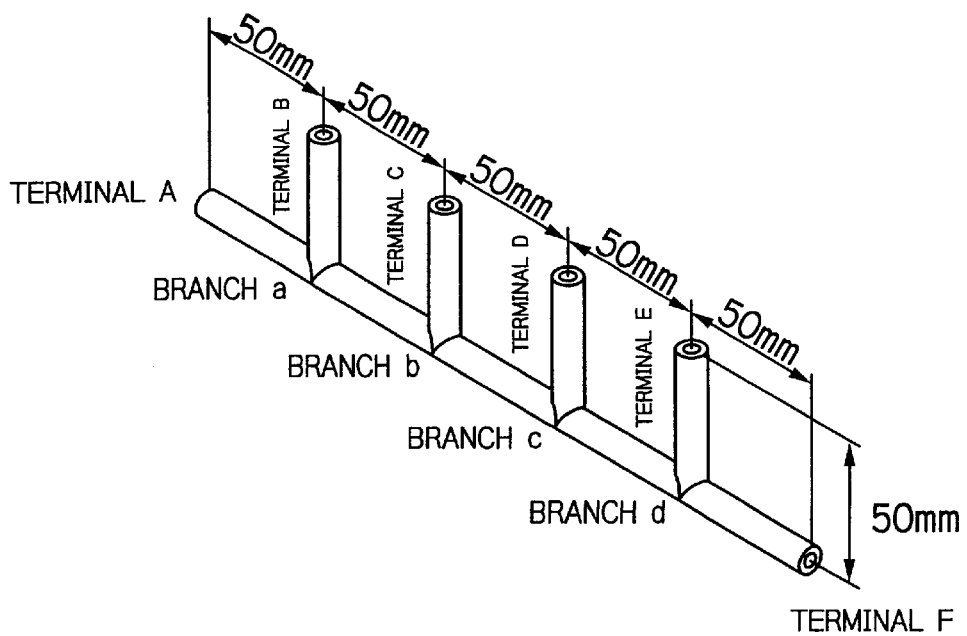

COVERING SHEET, TRIPLATE LINE USING THE SHEET, SIGNAL BUS FOR COMPUTER USING THE SHEET AND COVERING STRUCTURE OF ELECTRONIC CIRCUIT USING THE SHEET

FIELD OF THE INVENTION

The present invention relates to a covering sheet, a triplate line using the sheet, a signal bus for a computer using the sheet, and a covering structure of an electronic circuit using the sheet. Particularly, the present invention relates to a technology for achieving higher pbu of a signal bus mainly for a computer and to an electromagnetic-interference-preventing technology for suppressing unwanted signal radiation observed in signal lines of electronic equipment.

DESCRIPTION OF THE RELATED ART

Generally, the speeding up of central processing units (CPUs) has been pursued in order to increase the clock frequency of computers. However, there is a limit to what is done by increasing the speed of only CPU's, the achievement of the further increased processing-speed of computers requires the increased speed of data exchange between CPU's and peripheral equipment.

As shown in FIG. 1, a CPU 10 and peripheral equipment 11 to 14 are usually connected to each other through lines having a plurality of branches and being called a signal bus 15. The signal bus 15 should be made of non-matched branch lines, because talkers (sending ends) and listeners (receiving ends) change places as required. As a result, there can be troubles such as the delay of pulse build up (pbu) time, caused by the irregularities of pulse shapes resulting from the existence of reflected waves in the lines, and the break down of semiconductor elements due to voltage buildups caused by resonance.

In order to avoid such troubles, conventionally, damping resistance and absorbing type of high-cut filters have been inserted into the circuits. However, these measures have not been sufficient, because they have respective problems that pbu time can not be appreciably reduced and that not only signal waveforms but also the lengths of delay time are different before and after the filter.

On the other hand, there have been the following problems in the electromagnetic control technologies in digital equipment and high-frequency equipment such as computers and others. By the way, the electromagnetic interference refers to a phenomenon in which high frequency signals circulating in such equipment are radiated from the lines of the equipment to the outside so as to interfere with the other equipment.

Conventional electromagnetic control technologies include a method that suppresses the radiation of disturbing waves by covering the lines radiating disturbing waves with electromagnetic energy absorbing materials such as a ferrite-containing rubber sheet. However, the amount of energy absorbed by such a sheet is only 2–4 dB, so that the sufficient suppression of disturbing waves has not been achieved when the radiation is strong.

Also, there are radiation suppression measures using magnetic resin compounds for circuit boards, but this method has been not practicable because of the substantially increased cost of the boards. Further, mosaic boards having the magnetic resin compounds limited only to the line portions requiring them has been manufactured in order to reduce cost, but such mosaic boards is not in practical use because the flexibility of board design is impaired remarkably.

SUMMARY OF THE INVENTION

It is therefore an object of the invention to provide a covering sheet permitting increased pbu of a signal line such as a signal bus for a computer with the smallest difference in signal waveforms and delay times on the line, a triplate line using the sheet, a signal bus for computers using the sheet, and a covering structure of electric circuits using the sheet.

Another object of the invention is to provide a covering sheet for permitting more effective prevention of electromagnetic interference, a triplate line using the sheet, a signal bus for a computer using the sheet, and a covering structure of electronic circuits using the sheet.

According to the present invention, a covering sheet includes at least one magnetic material layer made of a resin compound having an oxide magnetic material or a metal magnetic material mixed therein, a ground conductor layer laminated on one surface of the magnetic material layer, and a plurality of via holes for passing a conductor for grounding the ground conductor layer.

A target signal line or signal bus formed on a circuit board is covered with such a covering sheet, and one end of the conductor passing through via holes is connected to the ground conductor layer, and then the other end of the conducting unit is connected to a ground conductor of the circuit board, thereby a triplate line structure being constructed. This structure can increase the pbu of the signal line or signal bus. From an analysis of the mechanism of pulse transmission on lines, it is known that a leading cause of the distorting of pulse shapes is the components of higher order harmonics included in reflected negative pulses from branches and positive pulses from terminals in the signal line or signal bus. Therefore, when signals in the signal line or signal bus have the frequency components of the signals extended as near as possible to the resonance frequencies of the line, the delay time of the pulses can be reduced because the build up of pulses are made earlier and the lines can be stabilized by the suppression of resonance.

Further, such a triplate line structure can realize the absorption and shielding of unwanted signals at the same time, and thus can suppress the external radiation of unwanted signals from the signal line or signal bus, thereby permitting more effective measures against electromagnetic interference. Also, a large scale integrated circuit (LSI) and the like mounted on the circuit board are covered with the covering sheet and one end of conducting unit passing through via holes is connected to the ground conductor layer and, at the same time, the other end of the conducting unit is connected to a ground conductor of the circuit board, thereby a triplate line structure being constructed. Such a triplate line structure can suppress the external radiation of unwanted signals from this electronic circuit, thus permitting more effective measures against electromagnetic interference.

A plurality of conducting unit connected through the plurality of via holes to the ground conductor layer so as to ground the ground conductor layer are preferably provided.

Also, according to the present invention, a covering sheet includes a laminate consisting of at least one magnetic material layer made of a resin compound having an oxide magnetic material or a metal magnetic material mixed therein and at least one dielectric layer having a permittivity lower than that of the magnetic material layer, and a ground conductor layer laminated on one surface of the laminate.

A target signal line or signal bus formed on a circuit board is covered with such a covering sheet having a dielectric layer, and one end of the conducting unit passing through via holes is connected to the ground conductor layer, and, at the same time, the other end of the conducting unit is connected to a ground conductor of the circuit board, thereby a triplate line structure being constructed. This triplate line structure can increase the pbu of the signal line or signal bus and also make the characteristic impedance of the sheet-covered portion near to free space impedance, because the dielectric layer has a permittivity lower than that of the magnetic material layer, thereby permitting the suppression of changes in the characteristic impedance of the signal line or signal bus.

Further, such a triplate line structure can realize the absorption and shielding of unwanted signals at the same time, and thus can suppress the external radiation of unwanted signals from the signal line or signal bus, or electronic circuits, thereby permitting more effective measures against electromagnetic interference.

Preferably, the dielectric layer is adjacent to the ground conductor layer, or the magnetic material layer is adjacent to the ground conductor layer.

Furthermore, according to the present invention, a covering sheet includes a magnetic material layer made of a resin compound having an oxide magnetic material or a metal magnetic material mixed therein, a dielectric layer being laminated on the magnetic material layer with one surface of the dielectric layer adjacent to the magnetic material layer and having a permittivity lower than that of the magnetic material layer, and a ground conductor layer laminated on the other side of the dielectric layer.

A target signal line or signal bus formed on a circuit board is covered with such a covering sheet having the dielectric layer, and one end of the conducting unit passing through via holes is connected to the ground conductor layer, and, at the same time, the other end of the conducting unit is connected to a ground conductor of the circuit board, thereby a triplate line structure being constructed. This triplate line structure can increase the pbu of the signal line or signal bus and also make the characteristic impedance of the sheet-covered portion near to free space impedance, because the dielectric layer has a permittivity lower than that of the magnetic material layer, thereby permitting the suppression of changes in the characteristic impedance of the signal line or signal bus.

Further, such a triplate line structure can realize the absorption and shielding of unwanted signals at the same time, and thus can suppress the external radiation of unwanted signals from the signal line or signal bus, or electronic circuits, thereby permitting more effective measures against electromagnetic interference.

Preferably, the dielectric layer is a layer of solid dielectric material or mainly a layer of air.

Preferably, a plurality of via holes for passing conducting unit for grounding the ground conductor layer are further provided. In this case, a plurality of conducting unit electrically connected to the ground conductor layer through the plurality of via holes so as to ground the ground conductor layer are preferably further provided.

According to the present invention, further, a triplate line or a signal bus for a computer having a triplate line structure, includes an insulator circuit board, a micro-strip line formed on one surface of the insulator circuit board, a ground conductor formed on the other surface of the insulator circuit board, and a covering sheet having an above described structure and being applied on the micro-strip line with the ground conductor positioned outside, wherein the ground conductor is electrically connected to the ground conductor.

Also according to the present the invention, a triplate line includes an insulator circuit board, a micro-strip line formed on one surface of the insulator circuit board, a first covering sheet having the above described structure and being applied on the micro-strip line with the ground conductor positioned outside, and a second covering sheet having the above described structure and being applied on the other surface of the insulator circuit board with the ground conductor positioned outside, wherein the ground conductors of the first and second covering sheets are electrically connected to a ground conductor of the insulator circuit board.

The constructing of a signal line or signal bus in such a triplate line structure can increase the pbu of the signal line or signal bus. From an analysis of the mechanism of pulse transmission on lines, it is known that a leading cause of distorting pulse shapes is the components of higher order harmonics included in the reflected negative pulses from branches and positive pulses from terminals in signal line or signal bus. Therefore, when signals in the signal line or signal bus have the frequency components of the signals extended as near as possible to the resonance frequencies of the line, the delay time of the pulses can be reduced because the build up of pulses is made earlier and the line can be stabilized by the suppression of resonance. That is, the resonance of the bus is so enough suppressed as to lessen a reduction in terminal voltage caused by negative pulses being reflected at the branch and coming therefrom. For this reason, resonance suppression in a distributed constant manner and a reduction in pulse build up time permits more effective driving of high frequency clocks.

In addition to this, by providing the dielectric layer having a permittivity lower than that of the magnetic material layer, the characteristic impedance of the sheet-covered portion can be made near to free space impedance, thereby permitting the suppression of changes in the characteristic impedance of the signal line or signal bus.

Further, such a triplate line structure can realize the absorption and shielding of unwanted signals at the same time, and thus can suppress the external radiation of unwanted signals from the signal line or signal bus thereby permitting more effective measures against electromagnetic interference.

Further, according to the present invention, a covering structure of electronic circuits includes an insulator circuit board, an electronic circuit formed on one surface of the insulator circuit board, a ground conductor formed on the other surface of the insulator circuit board, and a covering sheet having the above described structure and being applied on the electronic circuit with the ground conductor positioned outside, wherein the ground conductor is electrically connected to the ground conductor.

Because the absorption and shielding of unwanted signals are not only problems for buses but also are important problems for general electronic equipment, lines of disturbing sources are covered with the covering sheet of the invention, and further the ground conductor layer is grounded, thereby permitting the measures against electromagnetic interference which realize the absorption and shielding of unwanted signals in general electronic equipment at the same time.

This is not limited to lines but is the same in electronic circuits such as LSI placed on a circuit board. That is, according to the invention, the covering structure of electronic circuits includes an insulator circuit board, an electronic circuit formed on one surface of the insulator circuit board, a ground conductor formed on the other surface of the insulator circuit board, and a covering sheet having the above described structure and being applied on the electronic circuits with the ground conductor positioned outside, wherein the ground conductor is electrically connected to the ground conductor. As a result, the covering structure of electronic circuits can realize the absorption and shielding of unwanted signals at the same time and therefore can suppress the external radiation of unwanted signals in the electronic circuits such as LSI, thereby permitting more effective measures against electromagnetic interference.

Preferably, the ground conductor is connected to the ground conductor at a plurality of points.

Also, preferably, the ground conductor is electrically connected to the ground conductor via a plurality of via holes passing through the sheet.

Further objects and advantages of the present invention will be apparent from the following description of the preferred embodiments of the invention as illustrated in the accompanying drawings.

BRIEF DESCRIPTION OF THE DRAWINGS

FIG. 1 already described is a block diagram showing a general configuration of a computer;

FIG. 2 is a configuration diagram of a unit signal bus;

DESCRIPTION OF THE PREFERRED EMBODIMENTS

The process of the invention will be described before the description of embodiments of the invention.

First, pulse propagation in a bus line will be analyzed.

Let us take out a unit bus having six terminals A, B, C, D, E and F and four branches a, b, c and d, as shown in FIG. 2, from a bus line. It is assumed that this unit bus is made of lines of the same characteristic impedance (50Ω) and has branches spaced at the same spacing as the length of the branch lines (50 mm).

Therefore, the impedance at the branch portions is ½ of the characteristic impedance. When a signal is applied to one of the branches, a negative pulse having the level 9.5 dB lower than the input signal, corresponding to 0.5 dB of the transmission loss, is reflected and the remainder of the input signal is divided into two parts each generating pulses having a level 3.0 dB lower than the input signal, with 0.5 dB of the transmission loss. On the other hand, the impedance of the opened terminals is infinite, and thus a positive pulse is totally reflected at the opened terminals.

Figure 3:
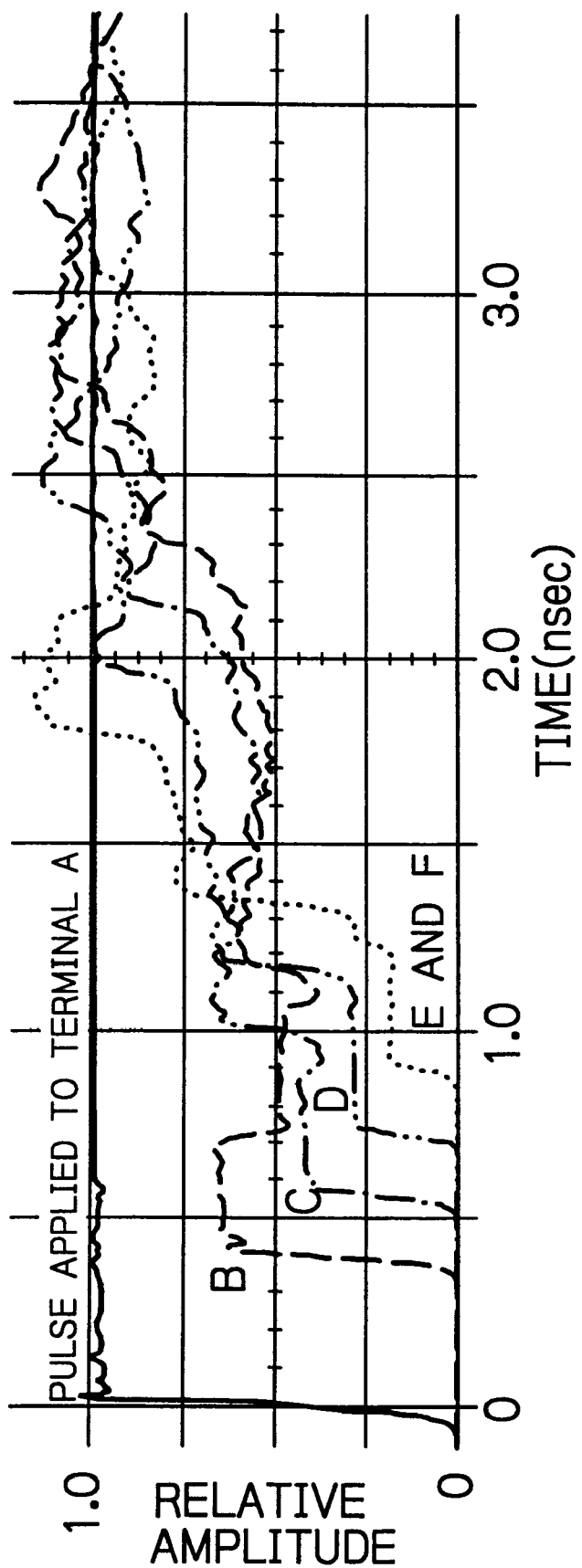
FIG. 3 is a time domain characteristic diagram showing a step pulse response of the unit signal bus.

In order to clarify the pulse propagation in the bus, a step pulse is applied to the terminal A. Then, the outputs obtained from the other terminals are shown in FIG. 3. Hereinafter, the time required for the pulse to propagate on the unit line is assumed to be 1 ut (unit time: 167 psec in this line). Thus, the pulse shape of the terminal B among the pulse shapes of each terminal will be interpreted as the combination of reflection and transmission at the branches and reflection at the terminals as follows.

(1) A step pulse applied to the terminal A (input signal) reaches to the branch a after 1 ut, and then undergoes the above described reflection and division of a pulse at the branch.

(2) One positive pulse divided at the branch a (at a level 3.5 dB lower than the input signal) reaches to the terminal B after 2 ut.

(3) The pulse reaching to the terminal B is totally reflected at the terminal B and travels toward the branch a.

(4) The pulse reflected at the terminal B undergoes the same reflection and division of a pulse at the branch as the previous one of (1) at the branch a after 3 ut. As a result, a negative pulse having a level 14 dB lower than the input signal travels toward the terminal B, and pulses having a level 7 dB lower than the input signal travels toward the terminal A and the branch b.

(5) The other positive pulse divided at the branch a (at a level 3.5 dB lower than the input signal) reaches to the branch b after 2 ut and undergoes the power division and reflection at the branch. Thus, a negative pulse having a level 14 dB lower than the input signal travels toward the branch a.

(6) A negative pulse reaching to the branch a after 3 ut undergoes the reflection and division of a pulse at the branch. As a result, negative pulses having a level 17.5 dB lower than the input signal travel toward the terminals A and B.

(7) The negative pulses reflected and divided at (4) and (6) are combined after 4 ut, and thus a negative pulse having a level 12.4 dB lower than the original signal travels toward the terminal B. As a result, the voltage of the terminal B, which has reached to a level of the logic 1 (above 50% of the total amplitude) since the terminal B received the first pulse input, turns to the logic 0. Thus, negative pulses from the subsequent branches are input to the terminal B one after another, so that the terminal voltage of B can not build up.

Also, a pulse at the terminal F will be interpreted as the combination of the reflection and transmission at the branches and the reflection at the terminals.

(8) The other positive pulse divided at the branch a (at a level 3.5 dB lower than the input signal) reaches to the branch b after 2 ut, thus undergoing the power division and reflection at the branch. As a result, positive pulses having a level 7 dB lower than the input signal travel toward the terminal C and the branch c.

(9) The pulse reaching to the branch c after 3 ut undergoes the reflection and division of a pulse at the branch. As a result, a positive pulse having a level 10.5 dB lower than the input signal travels toward the branch d.

(10) The pulse reaching to the branch d after 4 ut undergoes the reflection and division of a pulse at the branch. As a result, positive pulses having a level 14 dB lower than the input signal travels toward the terminals E and F.

(11) The positive pulse having traveled toward the branch b in (4) and having a level 7 dB lower than the input signal reaches to the terminal E and terminal F after 7 ut with a level 17.5 dB lower than the input signal, in the same process as in (8).

(12) The pulses having reached to the terminal C and terminal D each reaches to the terminal E and terminal F as positive pulses having the respective levels 17.5 dB and 21 dB lower than the input signals with a delay to each other by 2 ut, in the same process as in (11).

Figure 4:
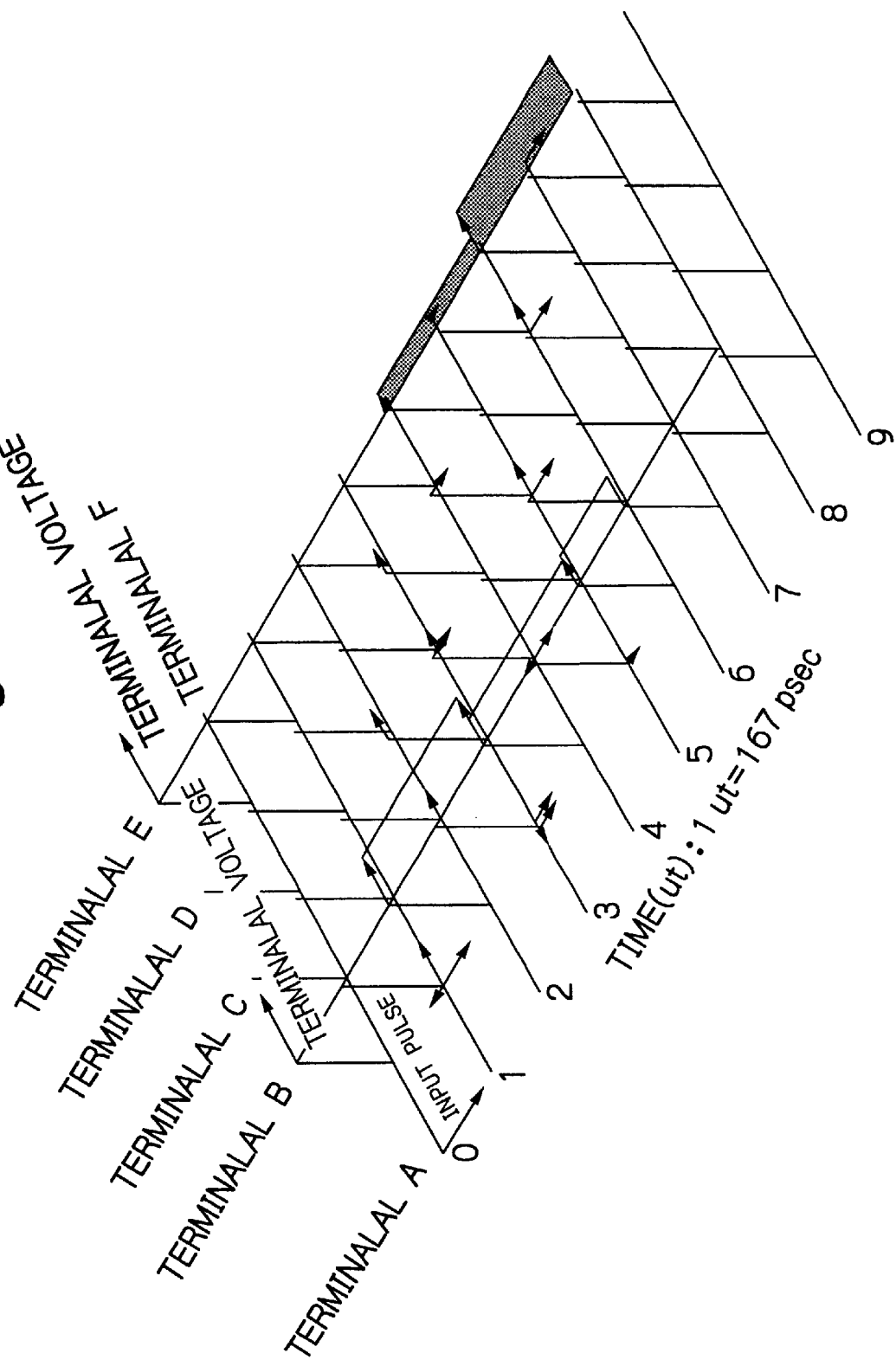
FIG. 4 is a pulse transmission diagram of the step pulse in the bus.

In this way, negative pulses are not input to the terminal E and terminal F from the branch, but only positive pulses are input thereto. Therefore, the terminal voltages of the most distant terminals E and F build up monotonically so as to form a pulse the earliest. The voltage of the terminal B first decreases due to negative pulses reflected at subsequent branches, and thereafter increases when the terminal B receives the positive pulse reflected at the end of the terminals. Thus, a voltage pulse is formed the latest at the nearest terminal B. The formation of these pulses is shown for the rising time of 2 to 4 ut in FIG. 4. As described above, a pulse is formed in a bus while reflected waves generated at the opened ends of the respective terminals are being recycled. Thus, the pulse build up time is the time required for a reflected wave from the most distant terminal to reach to the nearest terminal.

Figure 5:
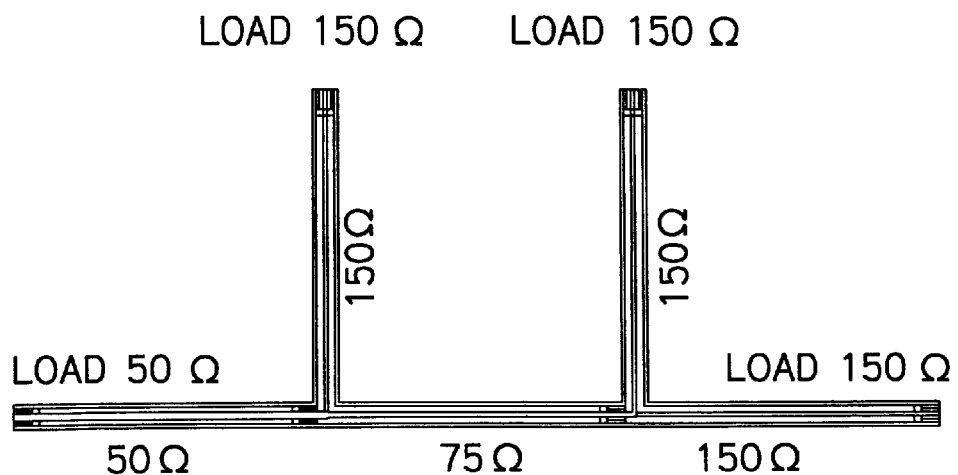
FIG. 5 is a cross sectional diagram showing an example of structures of a matching type of branch line.

When a talker and a listener are fixed in a branch line, a matching type of branch line can be constructed by combining lines and load resistances having characteristic impedances of 50Ω, 75Ω and 150Ω in such a manner as shown in FIG. 5. Because this line supplies pulse signals in power, the delay of pulses can be limited to only the delay of propagation time.

However, such branch line can not be used in a signal bus in which the talker and listener change places as required. Thus, the lines for use in the bus must be made of lines in which signals are supplied in voltage from opened lines. Therefore, there exist reflected waves in such lines without exception.

Figure 6:
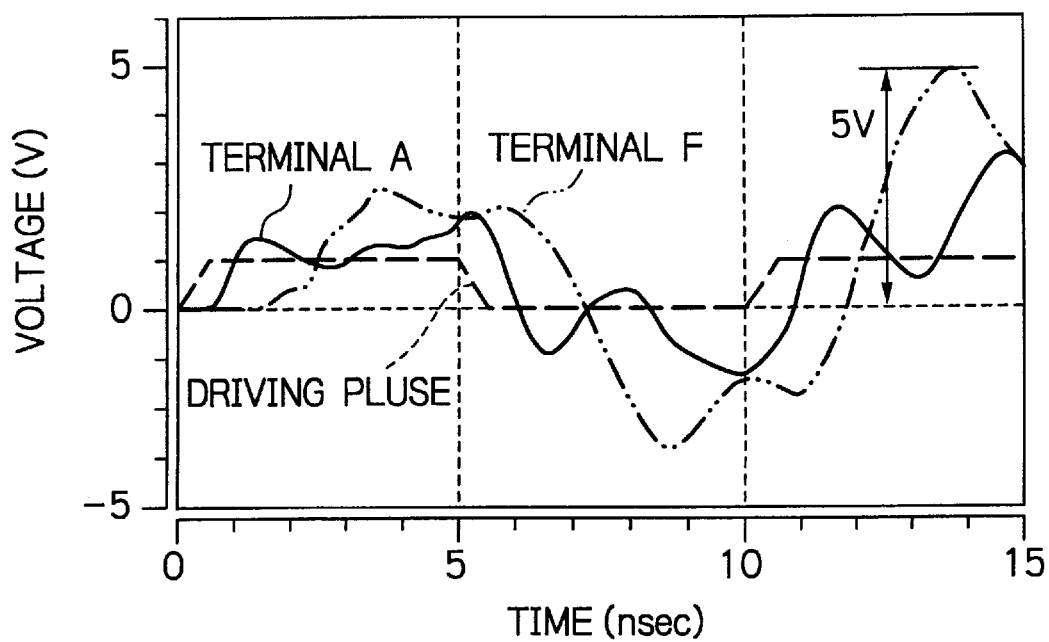
FIG. 6 is a characteristic diagram showing the response of a bus when a clock pulse is applied to the bus.

As responses of a bus when a clock pulse is applied to the bus, the results shown in FIG. 6 have been reported. This report also shows that the time of pulse build up is earliest at the most distant terminal and latest at the nearest terminal. Further, it reports a fear that resonance caused by reflected waves may destroy semiconductor elements. Owing to these troubles, it has been difficult to increase the frequency of clocks to be supplied to a signal bus for use in computers beyond 200 MHz.

Figure 7:
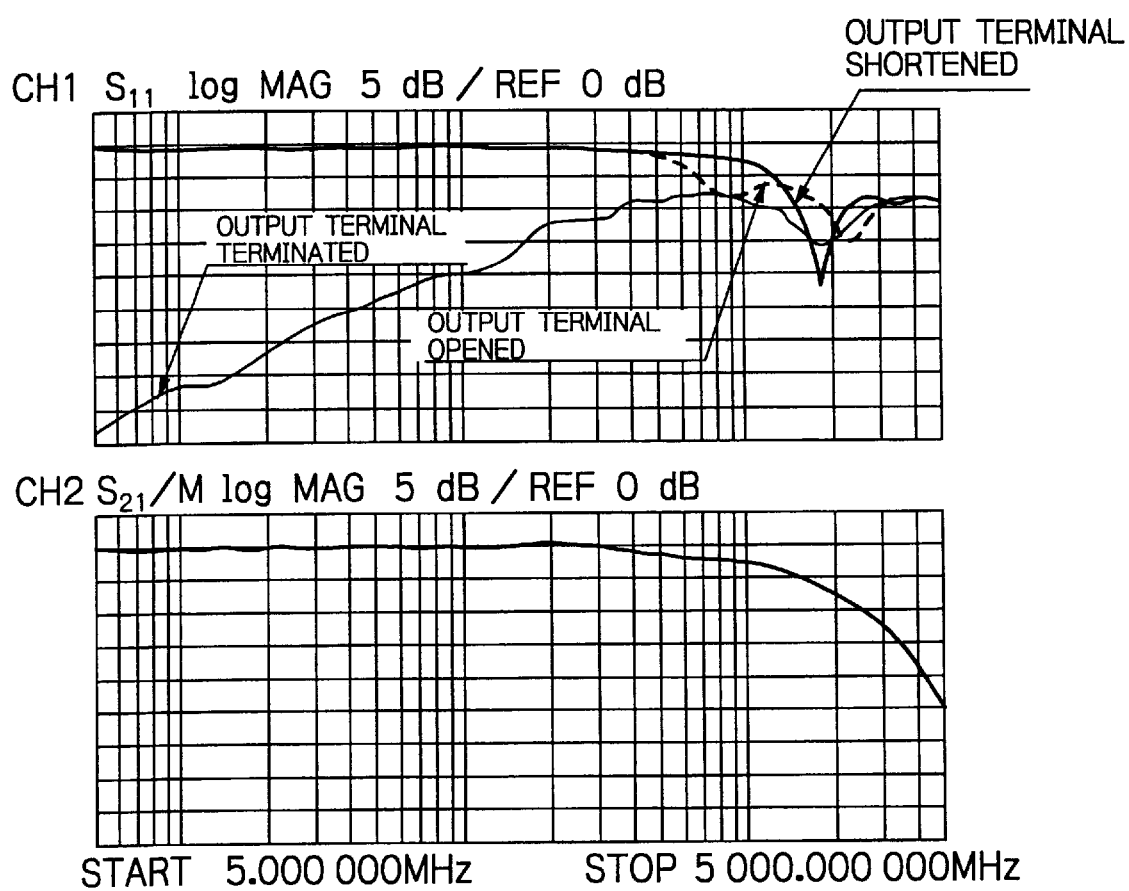
FIG. 7 is a diagram showing an example of characteristics of an absorbing type of high-cut filter.

Although it is a basic problem that reflected waves causes a delay in pulse propagation on a bus, the resonance-caused break down of semiconductor elements can be avoided by inserting an absorbing type of high-cut filter in the bus having the characteristic as shown in FIG. 7.

Figure 8:
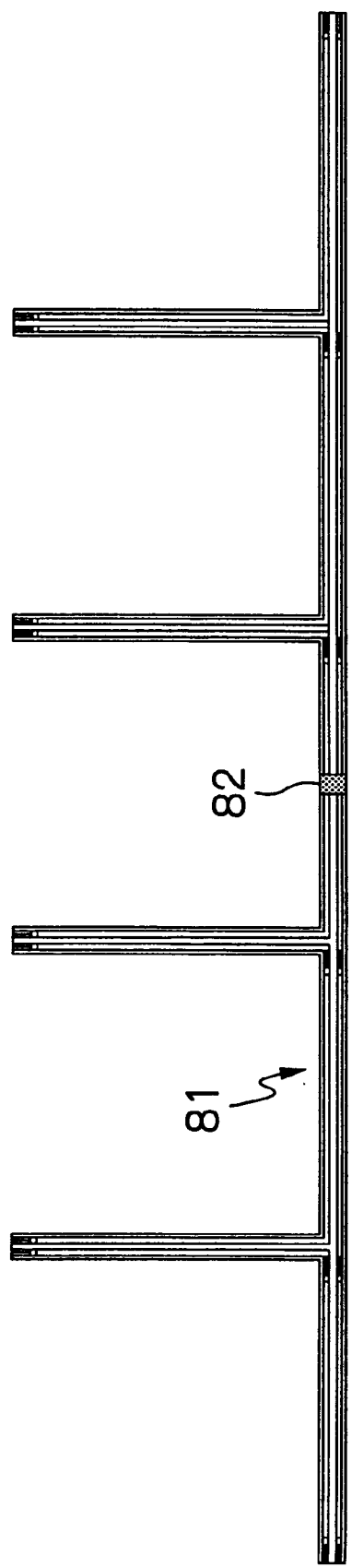
FIG. 8 is a cross sectional diagram showing an example of structures of a bus having an absorbing type of high-cut filter inserted therein.
Figure 9:
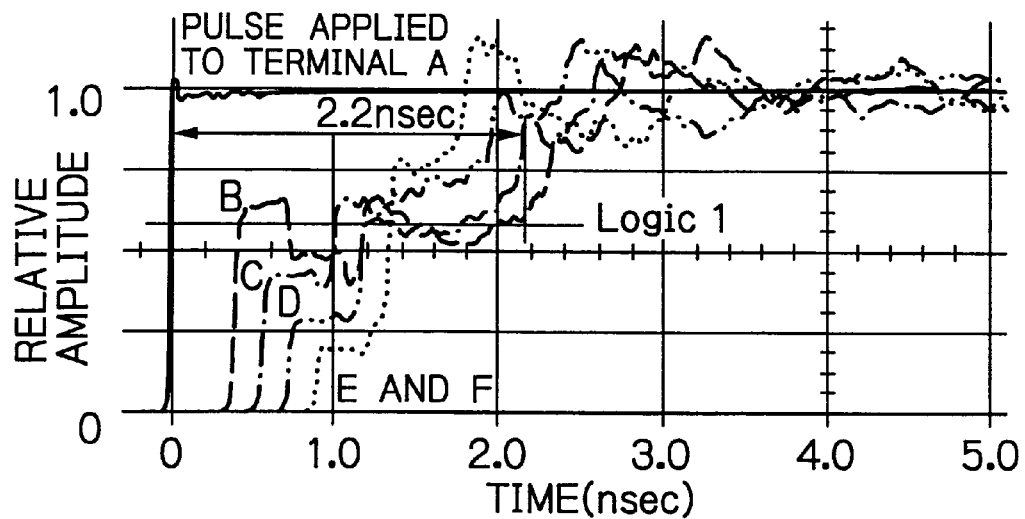
FIG. 9 is a time domain characteristic diagram showing a pulse response of a bus not having the filter.
Figure 10:
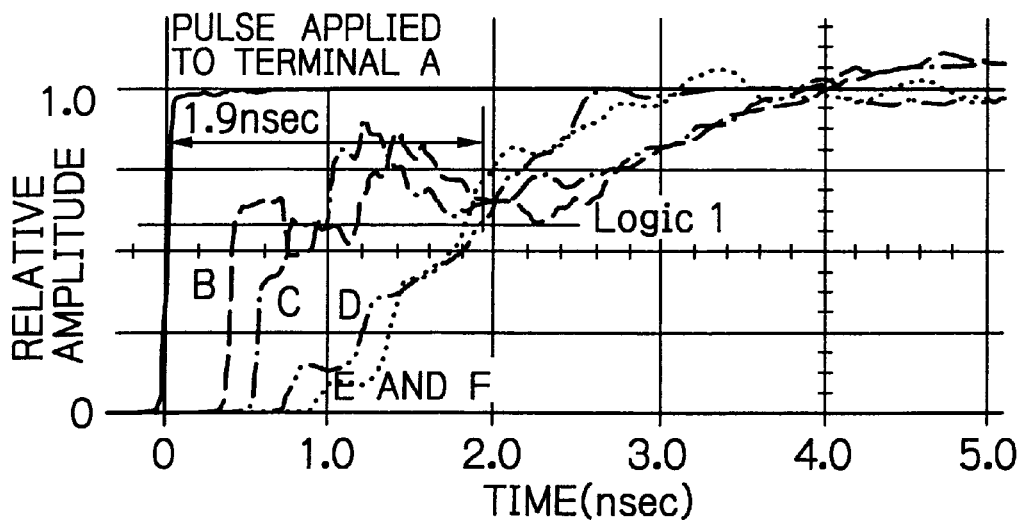
FIG. 10 is a time domain characteristic diagram showing a pulse response of the bus having the filter inserted.

This absorbing type of high-cut filter 80 is inserted in the center of a bus 81 as shown in FIG. 8, and then changes in the pulse response of the bus were examined. FIG. 9 shows the pulse response characteristics when the bus does not have the filter inserted, and FIG. 10 shows those when the filter is inserted in the bus.

These results show the following.
(a) Ripples in the pulse responses are reduced and thus resonance is suppressed.
(b) The time of pulse build up at the nearest terminal becomes earlier.
(c) The pulse build up time at the terminals subsequent to the filter becomes later due to the internal delay. The reduction in the pulse build up time is a phenomenon resulting from that the pulse build up at the nearest terminal becomes faster because the absorbing type filter absorbs higher order frequency components or harmonics in the negative pulses reflected at each branch, wherein the higher order harmonics contribute to the formation of the sharp edges of the pulse. Logic 1 is defined as a voltage value of 55% of the applied pulse voltage, and the time required for the output voltage of the terminals to reach to Logic 1 (pulse build up time) was used to evaluate the effect of the inserted filter.

It can be seen that although the pulse build up time is 2.2 nsec in the circuit not having the filter, the pulse build up time in the circuit having the filter inserted is reduced to 1.9 nsec including an increase in delay time. When the filter is not inserted, the output voltage of the nearest terminal B increases slowly due to the influence of negative reflected-pulses from the branches, so that the pulse build up time can be further later depending on the pulse waveform applied. Inserting the filter causes the negative reflected-pulses to be absorbed, so that the pulse build up time of the nearest terminal becomes shorter than that of the most distant terminal (terminal F). Thus, the effect based on the inserted filter can be seen very clear.

Thus, it can be found that the insertion of an absorbing type of high-cut filter in a bus can "not only suppress resonance but also reduces the pulse build up time, permitting high speed bus drive". At a clock bus of 200 MHz, the pulse build up time must be equal to and less than 2.5 nsec, which is ½ of one cycle period or 5 nsec. Therefore, a bus not having the filter is difficult to drive at 200 MHz clock because of few margins, but when the filter is inserted in the bus, enough margins is obtained to enable a 200 MHz clock.

However, in a circuit configuration having the filter inserted therein, pulse waveforms are greatly different between terminals on the drive side of the filter and terminals on the opposite side of the filters, and also the filter causes a difference in delay time. In order to resolve such problems, it is necessary to reduce differences in the delay time and the pulse waveform by inserting a filter having the less amount of absorption and less delay time in each branch.

Inserting the filter in each branch makes the circuit configuration so complicated that it is not practicable. Therefore, the invention overcomes this problem by constituting the whole bus as an absorbing type of high-cut filter for distributing energy absorption.

Hereinafter, the embodiments according to the invention will be described in detail.

Figure 11:
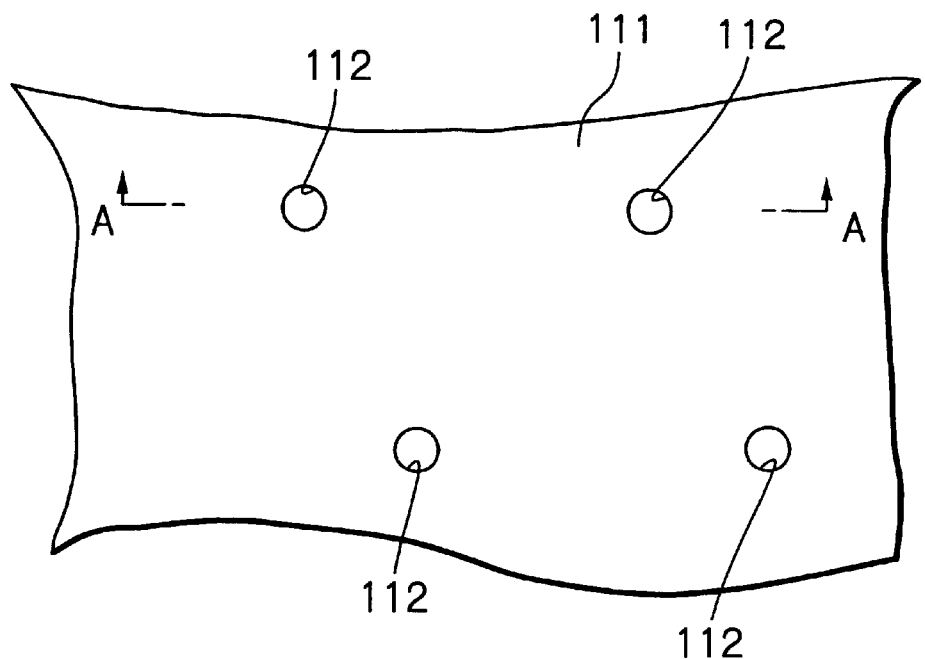
FIG. 11 is a plan diagram showing one embodiment of the covering sheet according to the invention.
Figure 12:
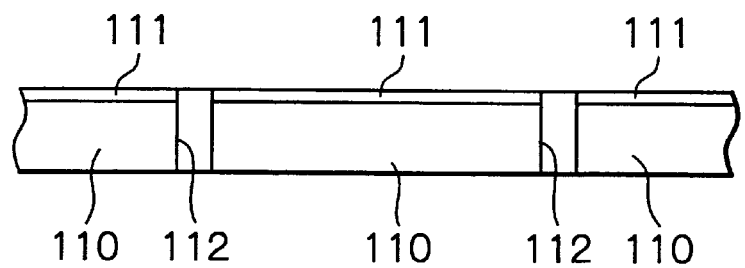
FIG. 12 is a cross sectional diagram of the covering sheet of FIG. 11 taken along the line A—A in the figure.

FIG. 11 is a plan diagram showing one embodiment of the covering sheet according to the invention, and FIG. 12 is a cross sectional diagram along the A—A line in FIG. 11.

In these figures, reference numeral 110 denotes a magnetic material layer, reference numeral 111 denotes a ground conductor layer laminated on the magnetic material layer 110, and reference numeral 112 denotes a plurality of via holes each passing through the covering sheet.

The magnetic material layer 110 is made of a resin compound having an oxide magnetic material or a metal magnetic material mixed therein, and has a thickness of about 0.5 mm in the present embodiment. The resin compound is, for example, a magnetic material made by kneading carbonyl-iron of about 85 wt % into rubber. The ground conductor layer 111 is copper foil adhered over to the whole surface of the magnetic material layer 110. The plurality of via holes 112 are for passing conducting unit for grounding the ground conductor layer 111.

The resin of the magnetic material layer 110 may include silicone rubber or chlorine-based rubber and the like. The oxide magnetic materials of the magnetic material layer 110 may include nickel zinc ferrite, manganese zinc ferrite, and hexagonal ferrite and the like. The metal magnetic materials of the magnetic material layer 110 may include iron silicon, permalloy and the like, in addition to pure-iron fine powder. The ground conductor layer 111 may include brass foil, nickel foil and the like, in addition to copper foil.

Further, the magnetic material layer 110 may be either of a single layer structure or a multi-layer structure.

Figure 13:
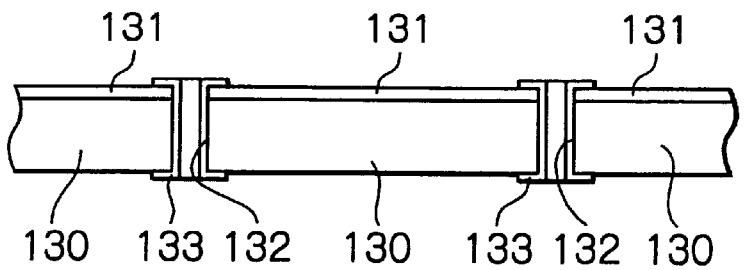
FIG. 13 is a cross sectional diagram of another embodiment of the covering sheet according to the invention.

FIG. 13 shows a cross sectional diagram of another embodiment of the covering sheet according to the invention.

In this figure, reference numeral 130 denotes a magnetic material layer, reference numeral 131 denotes a ground conductor layer laminated on the magnetic material layer 130, reference numeral 132 denotes a plurality of via holes each passing through the covering sheet, and reference numeral 133 denotes a grounding conductor having one end thereof electrically connected to the ground conductor layer 131 and passing through the via hole 132.

The magnetic material layer 130 is made of a resin compound having an oxide magnetic material or a metal magnetic material mixed therein, and has a thickness of about 0.5 mm in the present embodiment. The resin compound is, for example, a magnetic material made by kneading carbonyl-iron of about 85 wt % into rubber. The ground conductor layer 131 is copper foil adhered over to the whole surface of the magnetic material layer 130. The grounding conductor 133 includes a conductor material suitable for soldering, such as copper, brass, and nickel, and it has, for example, a grommet structure in this embodiment. The modifications and the like of materials making up each element are the same as in the case of the embodiments of FIG. 11 and FIG. 12.

Further, the magnetic material layer 130 may be either of a single layer structure or a multi-layer structure.

Figure 14:
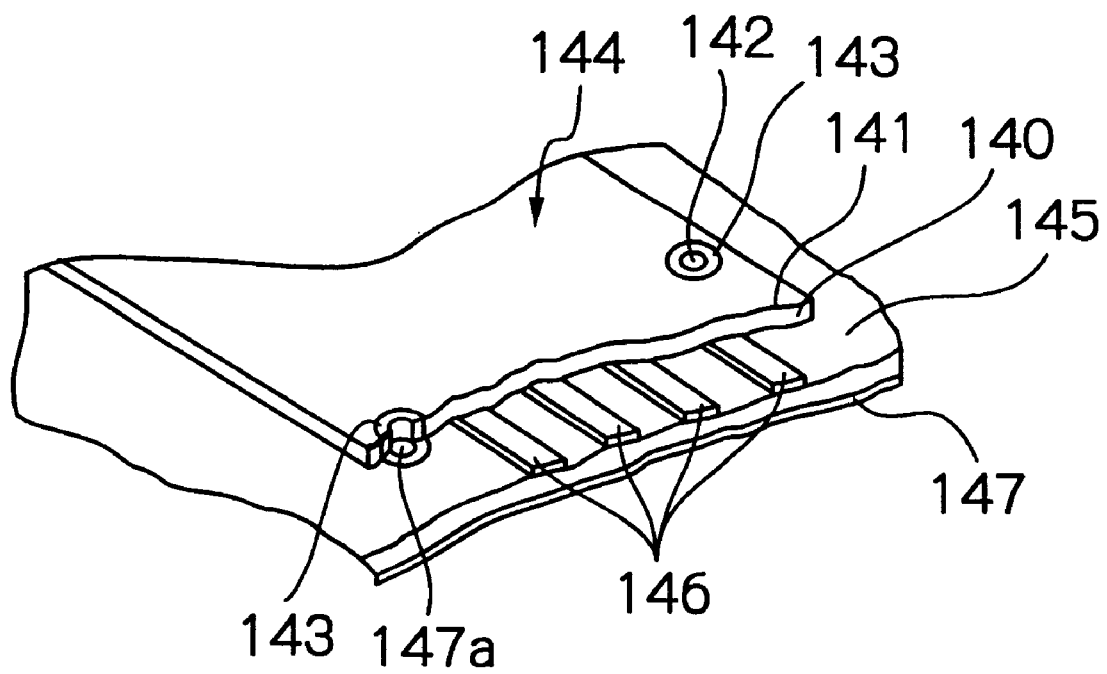
FIG. 14 is a perspective diagram showing a triplate absorbing type of high-cut filter line, in which the top of the bus is covered with the covering sheet having a ground conductor layer, as one embodiment of the triplate line according to the invention.

FIG. 14 is a perspective diagram showing a triplate absorbing type of high-cut filter line in which the top of the bus is covered with such a covering sheet, as one embodiment of the triplate line according to the invention.

In this figure, reference numeral 144 denotes a covering sheet, which includes a magnetic material layer 140, a ground conductor layer 141 laminated on the magnetic material layer 140, a plurality of via holes 142, and a plurality of grounding conductors 143 having one end thereof electrically connected to the ground conductor layer 141 and passing through the via holes 142, in the same manner as in the case of the embodiment of FIG. 13.

In FIG. 14, further, reference numeral 145 denotes a micro-strip circuit board, on one side of which a signal bus 146 for a computer is formed, and on the other side of which a ground conductor 147 is formed. The covering sheet 144 is applied on the micro-strip circuit board 145 so as to cover the bus 146. In this case, the sheet 144 is applied such that the ground conductor layer 141 of the sheet 144 may face outside. Further, the other end of the ground conductor 143 is electrically connected to the conducting portion of the ground conductor 147a which is formed on the micro-strip circuit board 145, thereby the grounding conductor 141 and the ground conductor 147 being electrically connected.

That is, the invention notes that a usual bus is constructed on a micro-strip circuit board, and thus covers the bus 146 with the covering sheet 144 such that the ground conductor layer 141 of the covering sheet may face upward, and electrically connects the ground conductor layer 141 to ground of the bus, thereby constructing a triplate absorbing type of high-cut filter line.

Hereinafter, the advantages of the invention will be made clear based on experimental results.

Figure 15:
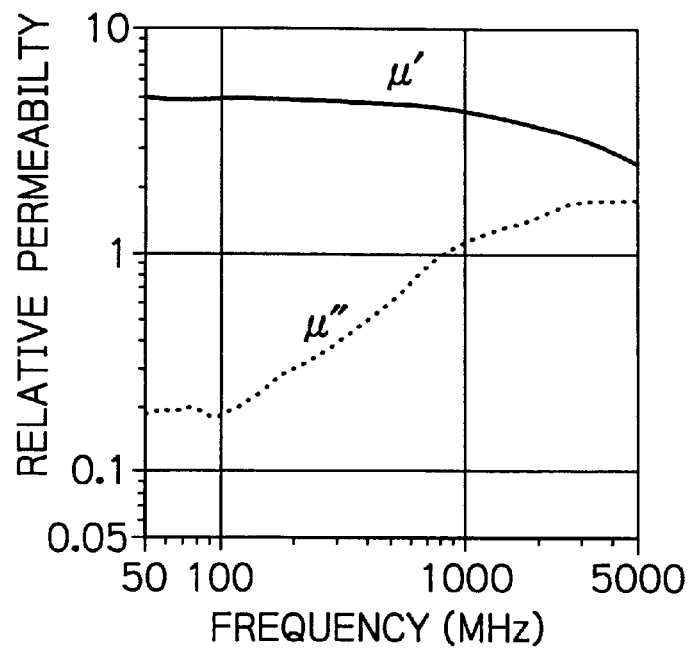
FIG. 15 is a frequency characteristic diagram of the relative permeability of the covering sheet according to the embodiment of FIG. 14.
Figure 16:
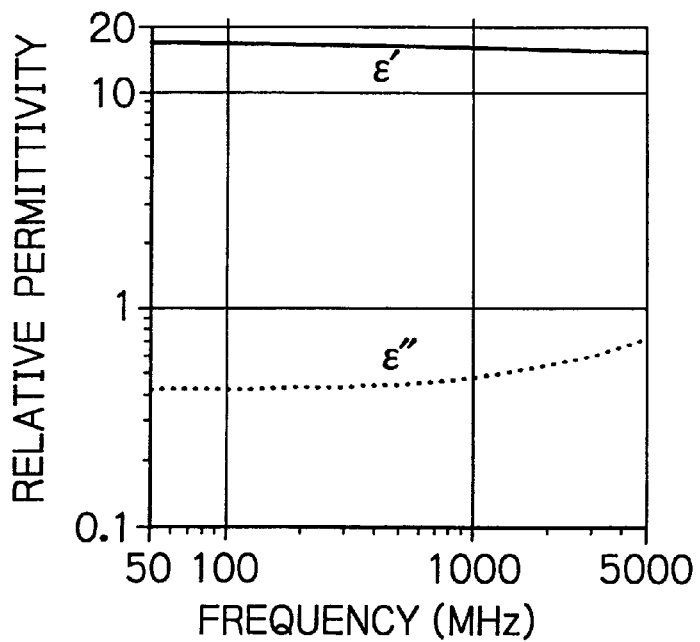
FIG. 16 is a frequency characteristic diagram of the relative permittivity of the covering sheet according to the embodiment of FIG. 14.

FIG. 15 and FIG. 16 shows electromagnetic characteristics of the covering sheet 144. FIG. 15 shows frequency characteristics of relative permeability, and FIG. 16 shows frequency characteristics of relative permittivity, respectively.

Figure 17:
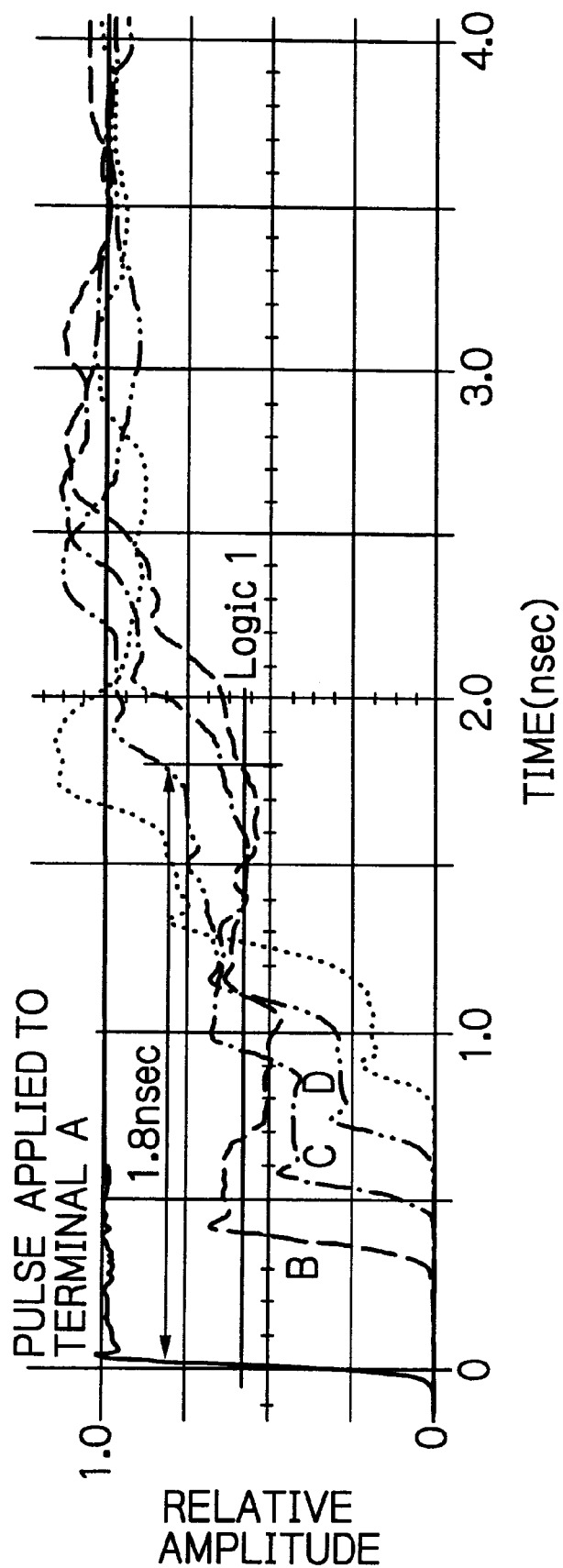
FIG. 17 is a time domain characteristic diagram showing a step pulse response of a micro-strip line.

First, the bus of a micro-strip line having characteristics equivalent to those of FIG. 2 was constructed on a glass epoxy circuit board, and the step pulse responses of the bus were determined. The results are shown in FIG. 17. Then, the line was covered with the covering sheet 144, thus constructing a triplate absorbing type of high-cut filter line. The step pulse responses of this line is shown in FIG. 18.

In an example of the case where an absorbing type of high-cut filter is provided in the center of the bus as shown in FIG. 10, fine ripples are observed before the wave front of the pulse passes through the filter, and the resonance suppression effect appears with the passage of time. However, in the characteristics of FIG. 17 and FIG. 18, such fine ripples are removed from the pulse responses at the outputs of all the terminals. Particularly, as shown in FIG. 18, in the triplate absorbing type of high-cut filter line, the fine ripples are removed from the front edge of the pulse even at the terminal near to the drive terminal. As a result, it can be understood that the resonance of the bus is more effectively suppressed. The achieved suppression of resonance in the whole line suggests that this line can be driven at higher clock frequency.

Figure 18:
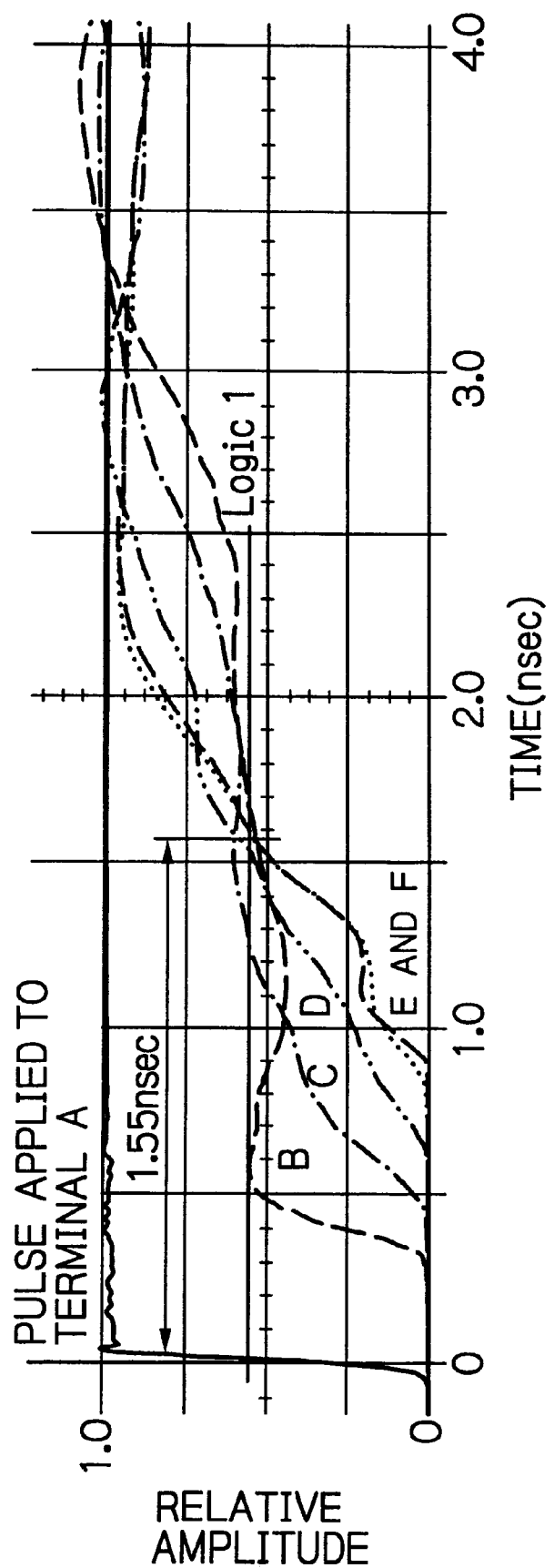
FIG. 18 is a time domain characteristic diagram showing a step pulse response of the triplate absorbing type of high-cut filter line according to the embodiment of FIG. 14.

Further, in the triplate absorbing type of high-cut filter line of FIG. 18, a reduction is observed in the effect of the phenomenon that the terminal voltage of a terminal near to the drive terminal reduces due to the negative pulses, which have been reflected at the branches and arrived at the terminal. Further, even though this sheet covering causes the delay time of the whole line to increase by about 0.2 nsec, the pulse build up time reduces from 1.8 nsec to 1.55 nsec. In addition, the pulse build up time of the nearest terminal (terminal B) is smaller than that of the most distant terminal (terminal F), as in the case of inserting the absorbing type of high-cut filter in the center of the bus. When these effects are summarized, it can be understood that a bus including a sheet with a ground conductor layer more effectively permits high speed clock drive, based on resonance suppression by a distributed constant manner and a reduction in the pulse build up time.

The line as described above can be realized up to a certain point by using a line constructed on a circuit board of magnetic material and resin compounds. However, such a circuit board forms a micro-strip structure not including magnetic materials on the upper half of the structure, and thus enough resonance suppression effect can not be provided. Further, because magnetic materials are mixed into the portion of such a circuit board not requiring them, the circuit board results in a large increase of cost, thus making the circuit board unsuitable for practical use. Although it can be considered to make up only the bus portion with magnetic material-resin compounds in a mosaic manner, this structure substantially impairs the flexibility of circuit board design and thus can not be practical.

According to the covering sheet of the present embodiment, which includes a magnetic material layer with a ground conductor layer, it is possible to cut the sheet into a suitable shape and then attach it to the circuit board after the completion of circuit board design, thus not impairing the flexibility of design. Further, it is possible to flexibly adapt to design changes of lines.

The bus of the embodiment has a standard length of a 200 MHz clock bus, and this line length corresponds to a ¼ wavelength of 300 MHz. In such a line, the electromagnetic induction between the lines and the electromagnetic wave radiation from the line become remarkable in a frequency band equal to and higher than the frequency of which ¼ wavelength corresponds to the length of the line. This is called "long line effect". Particularly, the radiation from the line substantially affects the other electronic equipment, and thus electromagnetic interference measures against the radiation are essential.

The generally used method for suppressing the radiation of such unwanted signals is to cover the lines with materials offering magnetic loss, such as ferrite rubber sheets, so as to absorb the unwanted signals. The triplate absorbing type of high-cut filter line using the covering sheet according to the embodiment covers the line of a noise source with an absorbing material and a ground plane, thereby realizing the absorption of radiated noises and shielding at the same time. As a result, more effective measures against electromagnetic interference can be realized.

In order to confirm a reduction in electromagnetic radiation by the triplate absorbing type of high-cut filter line according to the embodiment, it was performed in an RF anechoic chamber to measure noises radiated from an usual micro-strip line, a micro-strip line covered with a magnetic sheet being conventionally used as a disturbing-wave absorbing sheet and not having a ground plane, and the triplate absorbing type of high-cut filter line.

Figure 19:
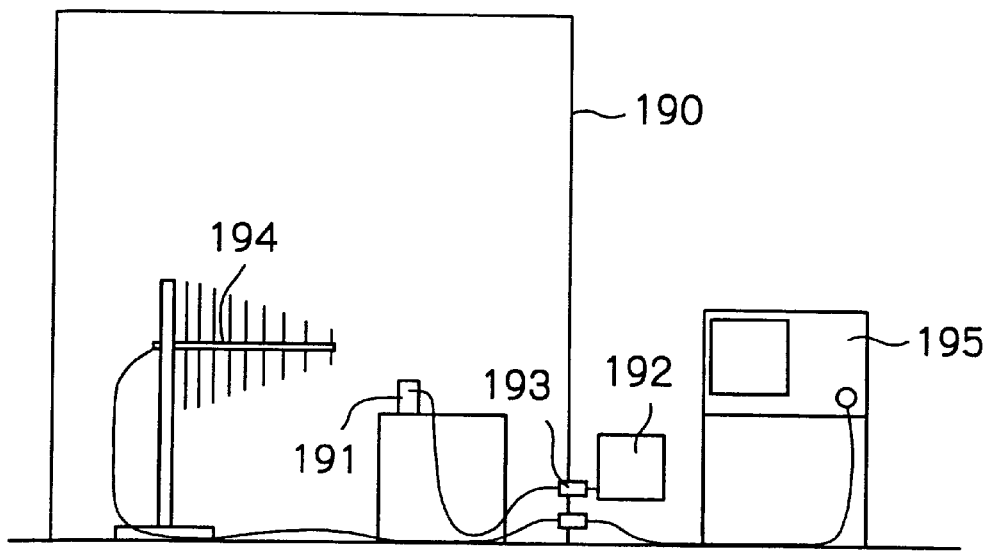
FIG. 19 is a configuration diagram of equipment for measuring the radiation of noises.

FIG. 19 shows the configuration of the measuring equipment. In this figure, reference numeral 190 denotes an RF anechoic chamber with shielding, reference numeral 191 denotes a line to be measured, placed in the RF anechoic chamber 190, reference numeral 192 denotes a clock generator supplying a pulse signal to this bus line via a shield-passing through portion 193, reference numeral 194 denotes a log-periodic antenna placed in the RF anechoic chamber 190, and reference numeral 195 denotes a receiver of the antenna 194, respectively.

Figure 20:
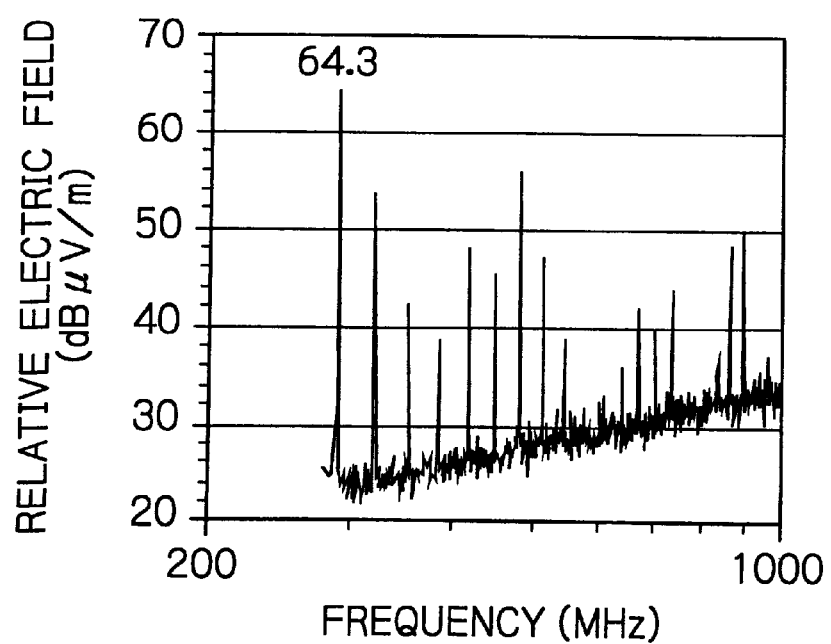
FIG. 20 is a characteristic diagram of measured relative electric field strength versus frequency.
Figure 21:
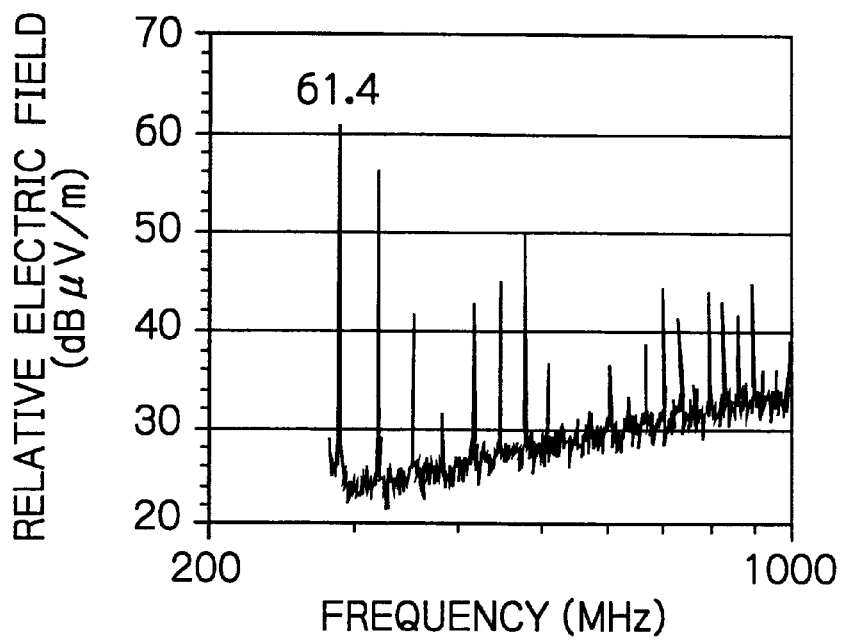
FIG. 21 is a characteristic diagram of measured relative electric field strength versus frequency.
Figure 22:
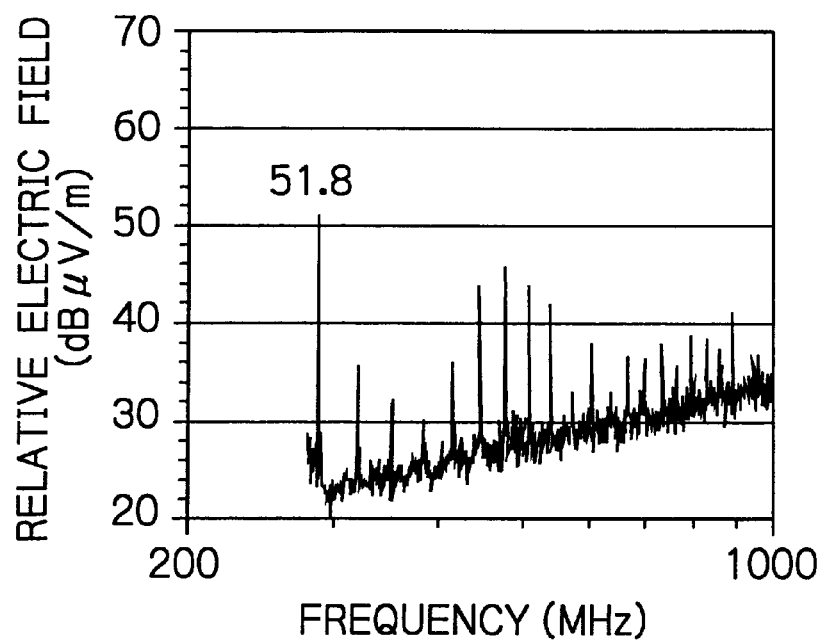
FIG. 22 is a characteristic diagram of measured relative electric field strength versus frequency.

FIGS. 20 to 22 show the characteristics of measured relative electric field strength versus frequency. FIG. 20 shows noise radiation from the usual micro-strip line, FIG. 21 shows noise radiation from the micro-strip line covered with a magnetic sheet not having a ground plane, and FIG. 22 shows noise radiation from the triplate absorbing type of high-cut filter line, respectively.

It can be understood from comparing FIG. 20 and FIG. 21 that in the case of covering the micro-strip line with a magnetic sheet not having a ground plane, the radiation of disturbing waves is reduced only by 3 dB. In contrast to this, as understood from the comparison of FIG. 20 and FIG. 22, in the case of the triplate absorbing type of high-cut filter line, in which a micro-strip line is covered with a magnetic sheet having a ground conductor layer and having the ground conductor layer connected to ground, the radiation of disturbing waves is reduced by 10 dB. As made clear from these results, radiated signals can be substantially reduced by replacing a micro-strip line with the triplate absorbing type of high-cut filter line, thus permitting more effective measures against electromagnetic interference based on the absorption of radiated noises and shielding. The absorption and shielding of unwanted signals are important problems not only for a bus but also in general electronic equipment. Therefore, by covering the lines of interference sources with a magnetic sheet having a ground conductor layer and having the ground conductor layer connected to ground, electromagnetic interference measures are realized such that the absorption and shielding of unwanted signals in general electronic equipment can be achieved at the same time.

Thus, when the triplate absorbing type of high-cut filter lines are made up by covering a target line with the covering sheet according to the present embodiment, it is possible to take measures against the portion actually generating disturbing waves after assembling the set and without a rise in cost, caused by making circuit boards with magnetic materials, thereby not impairing the flexibility of design.

The important points of the embodiment are not only to cover a line or bus with the covering sheet, but also to connect the ground conductor layer of the covering sheet to ground (connecting the ground conductor layer to a ground conductor of the circuit board). When the number of the ground points are more up to a certain degree, the absorption and shielding of radiated noises are more effective.

To confirm this, noise radiation from the triplate absorbing type of high-cut filter line various grounding schemes is measured in the RF anechoic chamber of FIG. 19.

Figure 23:
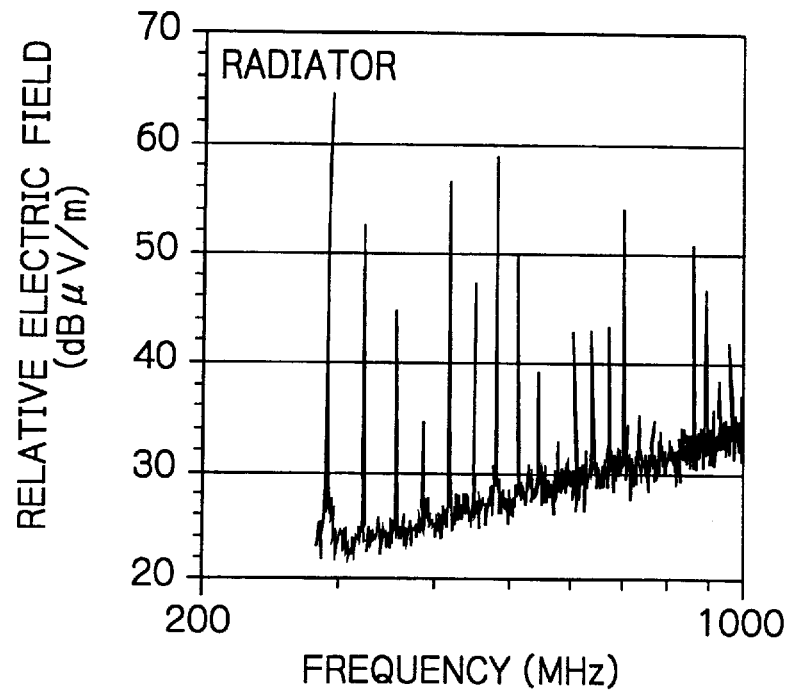
FIG. 23 is a characteristic diagram of measured relative electric field strength versus frequency.
Figure 24:
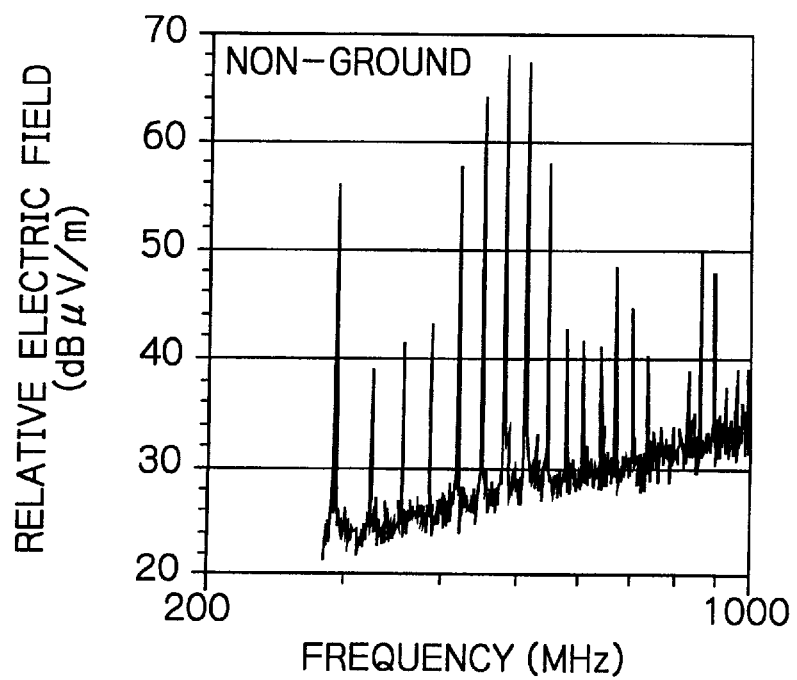
FIG. 24 is a characteristic diagram of measured relative electric field strength versus frequency.
Figure 25:
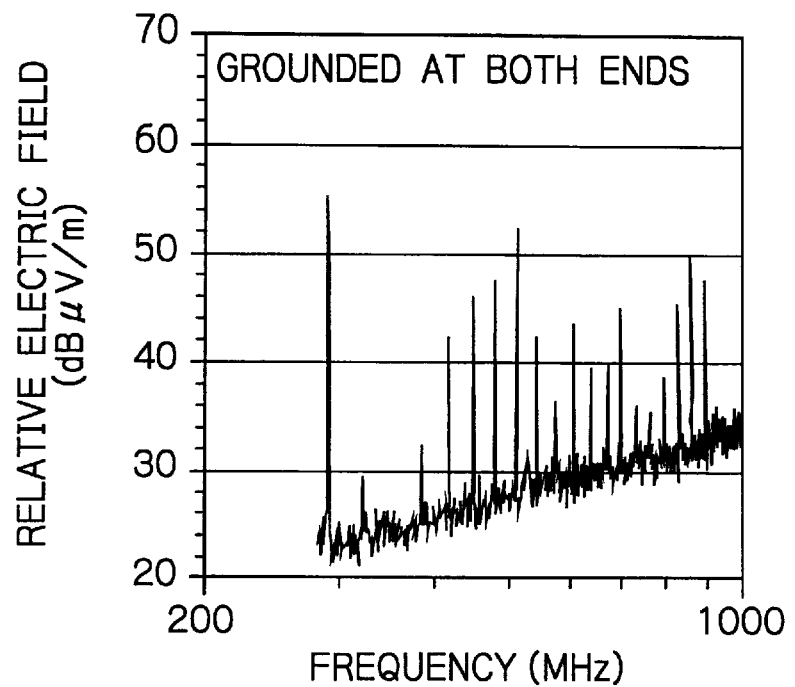
FIG. 25 is a characteristic diagram of measured relative electric field strength versus frequency.
Figure 26:
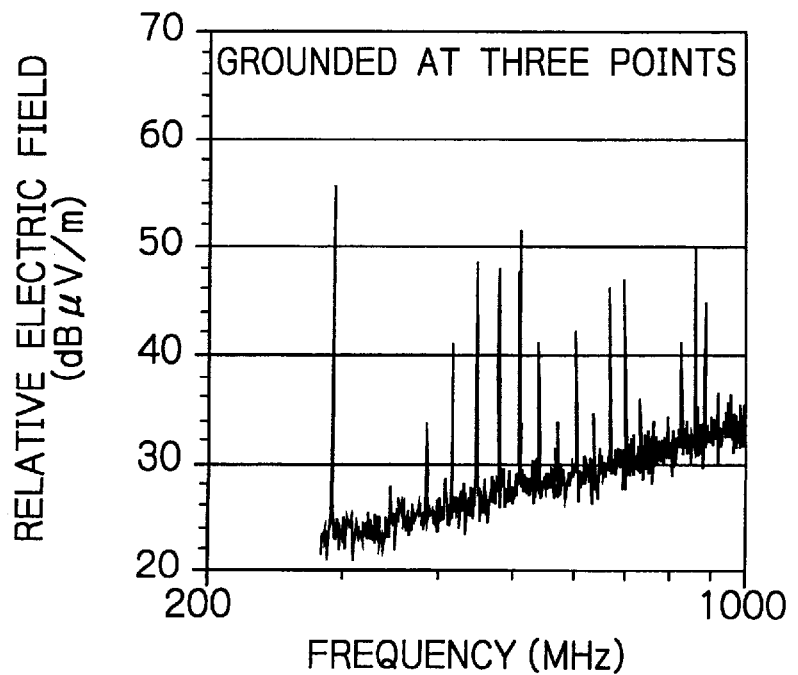
FIG. 26 is a characteristic diagram of measured relative electric field strength versus frequency.
Figure 27:
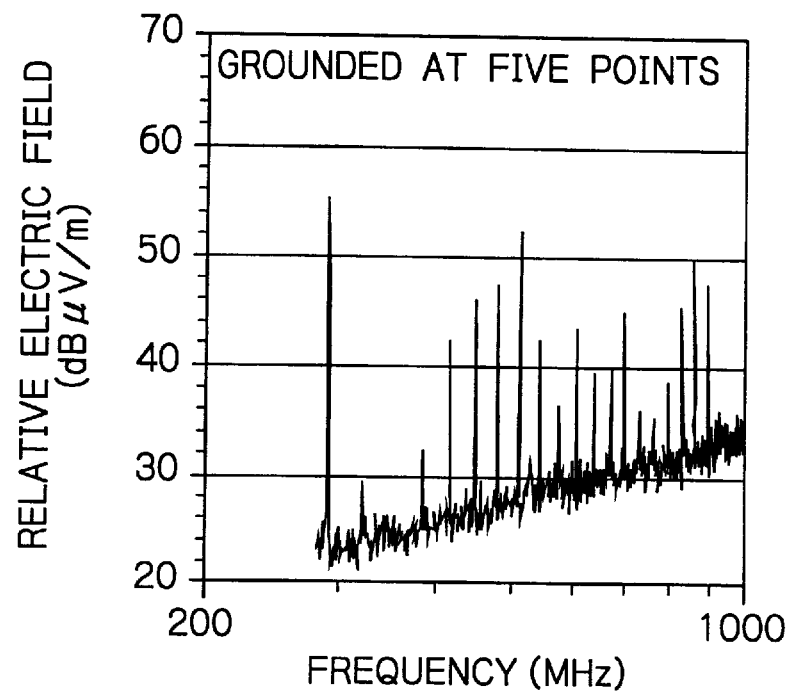
FIG. 27 is a characteristic diagram of measured relative electric field strength versus frequency.
Figure 28:
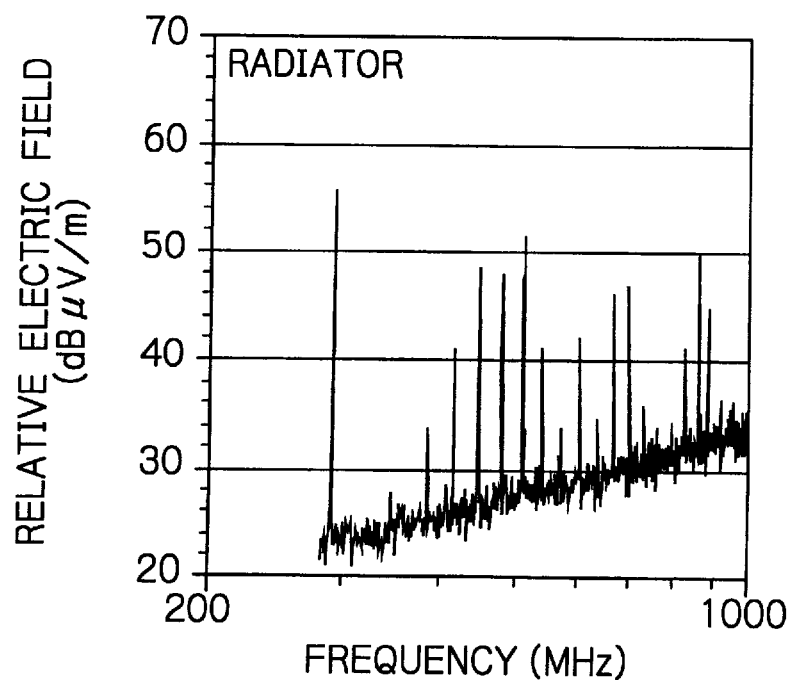
FIG. 28 is a characteristic diagram of measured relative electric field strength versus frequency.
Figure 29:
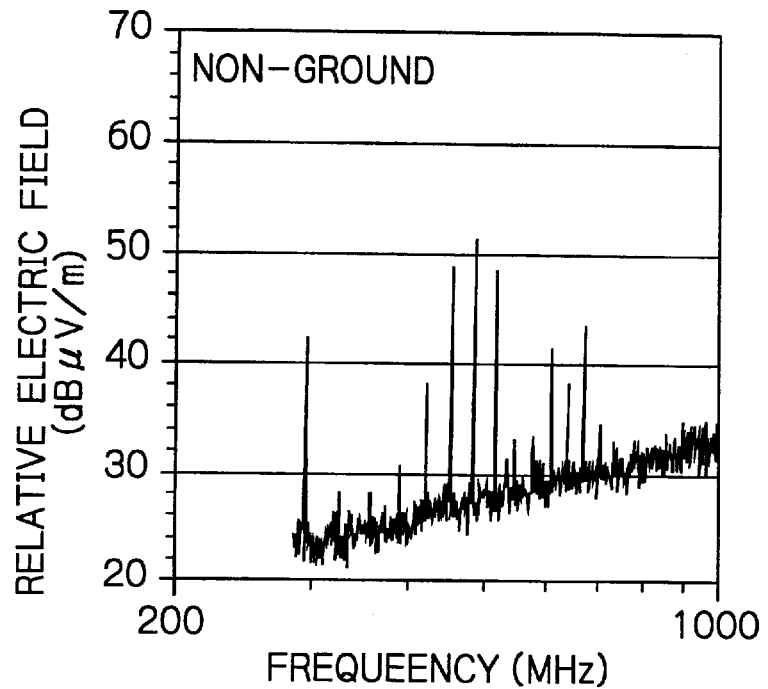
FIG. 29 is a characteristic diagram of measured relative electric field strength versus frequency.
Figure 30:
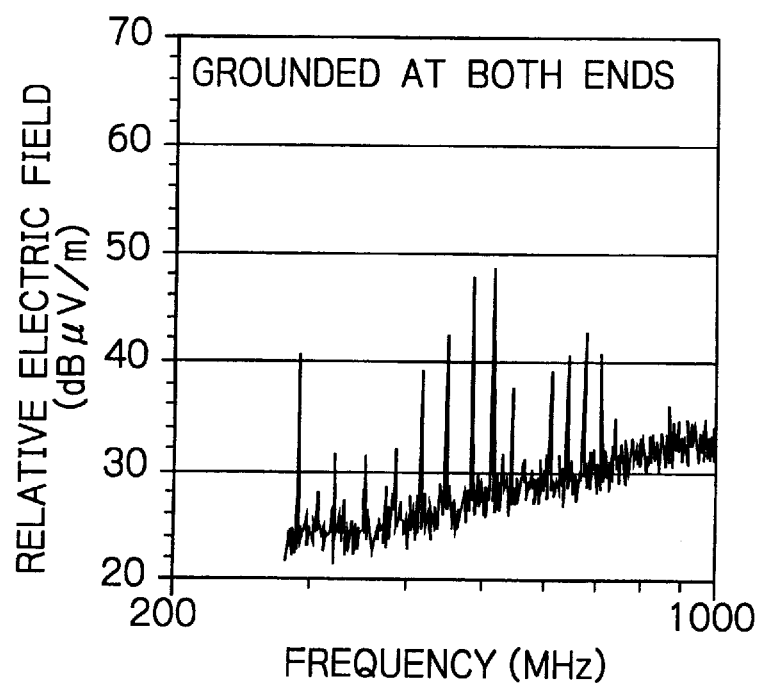
FIG. 30 is a characteristic diagram of measured relative electric field strength versus frequency.
Figure 31:
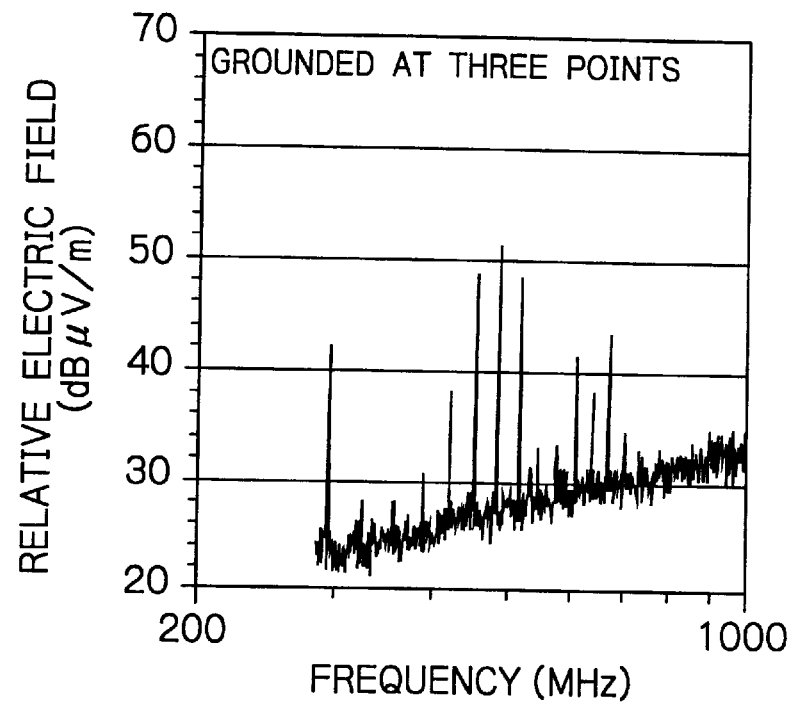
FIG. 31 is a characteristic diagram of measured relative electric field strength versus frequency.
Figure 32:
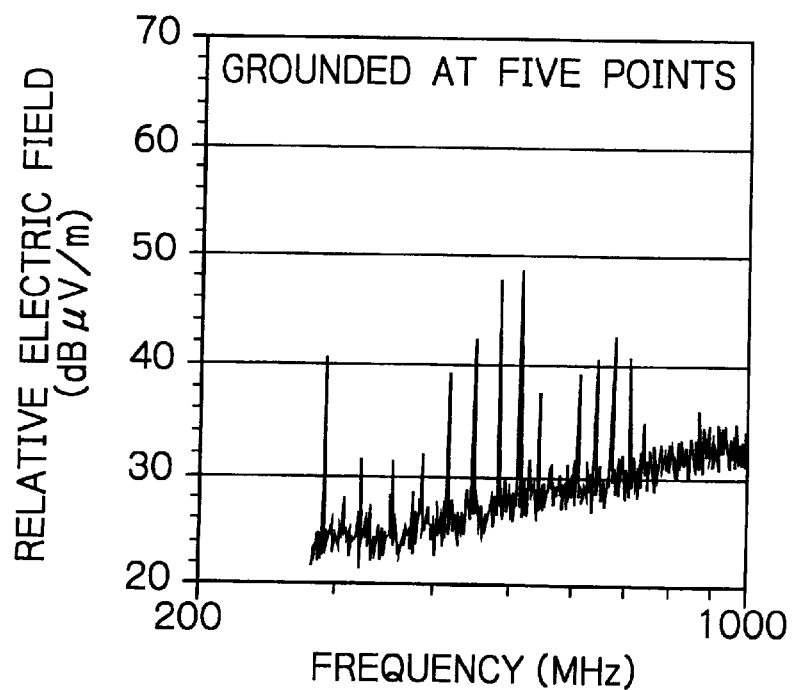
FIG. 32 is a characteristic diagram of measured relative electric field strength versus frequency.

FIGS. 23 to 27 show the characteristics of relative electric field strength versus frequency obtained from measurement by horizontally polarized waves, and FIGS. 28 to 32 show the characteristics of relative electric field strength versus frequency obtained from measurement by vertically polarized waves. FIGS. 23 and 28 show relative electric field of the radiator itself, FIGS. 24 and 29 show the case of non-ground, FIGS. 25 and 30 shows the case where both ends of the lines are grounded, FIGS. 26 and 31 show the case where three points along the lines are grounded, and FIGS. 27 and 32 show the case where five points along the lines are grounded.

Figure 33:
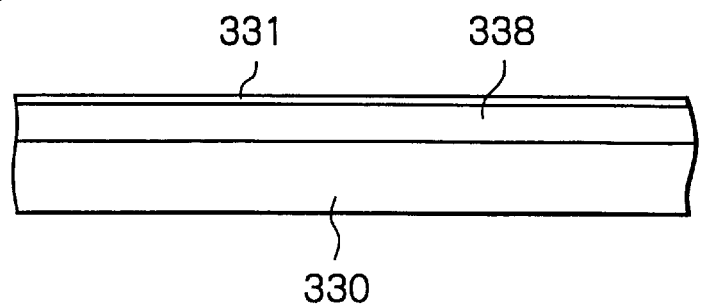
FIG. 33 is a cross sectional diagram of a further other embodiment of the covering sheet according to the invention.

FIG. 33 is a cross sectional diagram of a further other embodiment of the covering sheet according to the invention.

In this figure, reference numeral 330 denotes a magnetic material layer, reference numeral 338 denotes a dielectric layer being laminated on the magnetic material layer 330 having a permittivity lower than that of the magnetic material layer 330, and reference numeral 331 denotes a ground conductor layer laminated on the dielectric layer 338.

The magnetic material layer 330 is made of a resin compound having oxide magnetic materials or metal magnetic materials mixed therein and having a thickness of about 0.5 mm in the present embodiment. The resin compound includes, for example, a magnetic material made by kneading carbonyl-iron of about 85 wt % into rubber. The dielectric layer 338 includes a layer of solid dielectric material having a low permittivity or mainly a layer of air. The ground conductor layer 331 includes copper foil adhered over to the whole surface of the dielectric layer 338.

The resin of the magnetic material layer 330 may include silicone rubber or chlorine-based rubber and the like. The oxide magnetic materials of the magnetic material layer 330 may include nickel zinc ferrite, manganese zinc ferrite, and hexagonal ferrite and the like. The metal magnetic materials of the magnetic material layer 330 may include iron silicon, permalloy and the like, in addition to pure-iron fine powder. When the dielectric layer 338 is formed mainly by a layer of air, it has honeycomb construction interposed in the portion of the layer, which honey comb construction is formed of spacer or paper or plastic. The solid dielectric material layer of the dielectric layer 338 may includes silicone rubber, chlorine-based rubber, vinyl chloride, polyethylene, foamed polyethylene, foamed silicone, foamed styrol, foamed teflon and the like. The ground conductor layer 331 may include brass foil, nickel foil and the like, in addition to copper foil.

Further, the magnetic material layer 330 and/or the dielectric layer 338 may be either of a single layer structure or a multi-layer structure.

Figure 34:
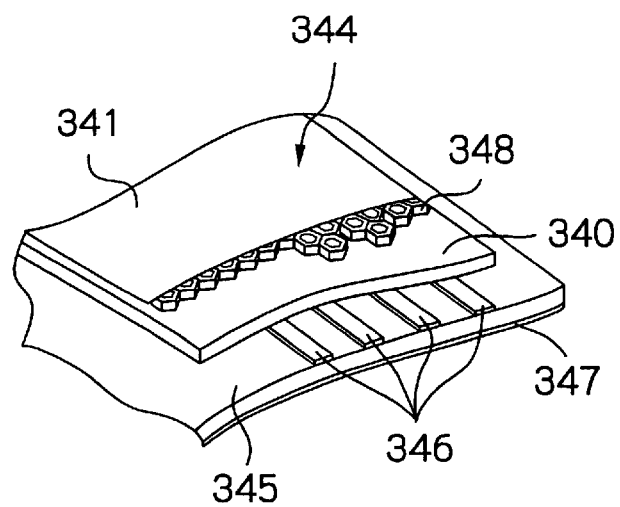
FIG. 34 is a perspective diagram showing a triplate absorbing type of high-cut filter line, in which the top of the bus is covered with the covering sheet having a ground conductor layer, as another embodiment of the triplate line according to the invention.

FIG. 34 is a perspective diagram showing a triplate absorbing type of high-cut filter line in which the top of a bus is covered with such a covering sheet, as an other embodiment of the triplate line according to the invention.

In this figure, the reference numeral 344 denotes the covering sheet. As in the case of the embodiment of FIG. 33, this covering sheet includes a magnetic material layer 340, a dielectric layer 348 having honeycomb construction and being laminated on the magnetic material layer 340, and a ground conductor layer 341 laminated on the dielectric layer 348. The dielectric layer 348 is a layer of air provided with honeycomb construction formed of paper or plastic.

Further, in FIG. 34, reference numeral 345 denotes a micro-strip circuit board, on one side of which a signal bus 346 for a computer are formed, and on the other side of which a ground conductor 347 is formed. The covering sheet 344 is applied over the micro-strip circuit board 345 so as to cover the buses 346. In this case, the sheet 344 is applied such that the ground conductor layer 341 of the sheet may face outside. Further, the grounding conductor 341 and the ground conductor 347 are electrically connected by conducting unit not shown.

That is, the invention notes that a usual bus is constructed on a micro-strip circuit board, and covers the top of the bus 346 with the covering sheet 344 such that the ground conductor layer 341 of the sheet may face upward, and electrically connects the ground conductor layer 341 to ground of the bus, thereby constructing a triplate absorbing type of high-cut filter line.

Particularly, in this embodiment, by interposing the dielectric layer 348 of low permittivity between the magnetic material layer 340 and the ground conductor layer 341, the characteristic impedance of the covering sheet 344 is made near to the characteristic impedance value of free space, thereby preventing the characteristic impedance of the line from being changed by the addition of the covering sheet 344. Because the magnetic loss of this structure is less changed, it is obvious that higher speed drive of the bus can be also achieved by using a covering sheet having such structure.

Hereinafter, the effect of interposing a dielectric substance of low permittivity will be described in detail.

The characteristic impedance of a TEM mode transmission line such as a micro-strip line and the triplate line can be expressed by the following Equation (1).

$$Z_0 = 120\pi \sqrt{\frac{\mu_r}{\varepsilon_r}} F(W/T) \quad (1)$$

Therein, $120\pi$ corresponds to free space impedance, $(\mu_r/\varepsilon_r)$ corresponds to a circuit board coefficient, and $F$ (W/T) corresponds to a shape factor. Further, $\mu_r$ and $\varepsilon_r$ are relative permeability and relative permittivity of the circuit board, W is the line width, and T is the thickness of the circuit board.

Figure 35:
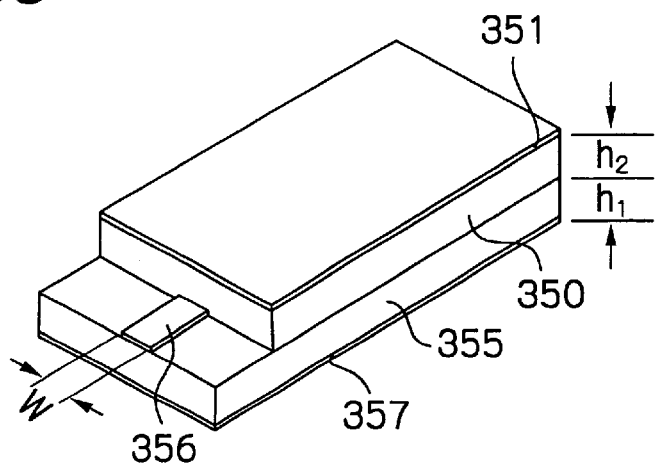
FIG. 35 is a model diagram of the triplate line.

FIG. 35 is a model diagram of the triplate absorbing type of high-cut filter line. In this figure, reference numeral 355 denotes a micro-strip circuit board, reference numeral 356 denotes a micro-strip line formed on the surface of the circuit board 355, reference numeral 357 denotes a ground conductor formed on the back side of the circuit board 355, reference numeral 350 denotes a magnetic material layer formed on the circuit board surface so as to cover the micro-strip line 356, and reference numeral 351 denotes a ground conductor layer formed on the magnetic material layer 350.

The characteristic impedance $Z_0$ of the line is a product of the characteristic impedance of the circuit board (also called boundary impedance) and the shape factor determined by the line width (W) and the distances ($h_1$ and $h_2$) between the line and each of the ground conductor and ground conductor layer. If the characteristic impedance of the space-adjoining portion of the micro-strip line is a value near to that of free space impedance, that is, if the circuit board coefficient is approx. 1, the impedance changes of the line caused by the sheet covering can be suppressed.

As the characteristic impedance of a line is determined by the permittivity of the circuit board, the variations of the impedance caused by the added covering-sheet is about ½ of the variation portions of the characteristic impedance of the covering sheet. If the circuit board coefficient can be adjusted in the range of 2½, the standing wave ratio due to the covering sheet can be made equal to and less than 2. The standing wave ratio of the whole of a line coated with a sheet having standing wave ratio of not more than 2 is not more than 1.5 and thus the reflection loss of the line is 0.25 dB. Thus, the influence of covering can be reduced. Because the permittivity of the covering sheet described above is about 20 and the relative permeability thereof is about 4, it is enough to reduce effective permittivity without changing the relative permeability. Such a structure can be realized by interposing a dielectric layer having a low permittivity between the magnetic material layer 350 and the ground conductor layer 351.

That is, an attempt is done to reduce an effective permittivity between the line and the ground conductor layer, while suppressing the reduction of the relative permeability by interposing a dielectric substance between a magnetic material layer and a ground conductor layer adjoining thereto, for controlling the input impedance independently of the absorption amount in the triplate line. As shown in the previous Equation (1), the line impedance can be controlled by the permeability and permittivity of the line supporting material.

Hereinafter, changes in the permeability and permittivity when a dielectric substance is interposed between the ground conductor layer and the magnetic material layer are theoretically determined.

Suppose that the transmission mode in a line is a TEM mode, similarity principles can be used and thus calculation will be performed on the model of a coaxial tube, in which strict solutions can be determined.

Figure 36:
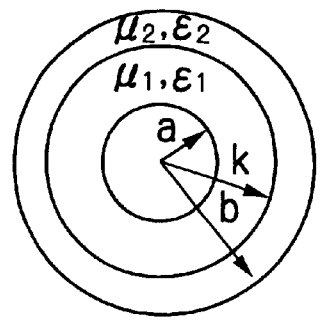
FIG. 36 is a diagram showing the model of a coaxial tube.

The structure of a coaxial line is shown in FIG. 36 and the following are assumed; the inside diameter: a, outside diameter: b, the outside diameter of a magnetic material: k, the relative permeability of the magnetic material: $\mu_1$, the relative permittivity of the magnetic material: $\varepsilon_1$, the relative permeability of a dielectric substance interposed in between a grounding conductor and the magnetic material: $\mu_2$, the permittivity of the dielectric substance interposed in between a grounding conductor and the magnetic material: $\varepsilon_2$, the permittivity of vacuum: $\mu_0$, the permeability of vacuum: $\varepsilon_0$.

The inductance per unit length L' of this coaxial tube is given by the following Equation (2).

$$L' = \int_a^k \mu_0\mu_1 \frac{dr}{2\pi r} + \int_k^b \mu_0\mu_2 \frac{dr}{2\pi r} = \mu_0\mu_1 \ln\frac{k}{a} + \mu_0\mu_2 \ln\frac{b}{k} \quad (2)$$

Here, assuming $$L = \int_a^b \mu_0\mu_1 \frac{dr}{2\pi r} = \mu_0\mu_1 \ln\frac{b}{a} \equiv \mu_1 L_0$$

the Equation (2) can be transformed into the following Equation (3).

$$L' = \mu_1\left[1 + \left(\frac{\mu_2}{\mu_1} - 1\right)\frac{\ln\frac{b}{k}}{\ln\frac{b}{a}}\right]L_0 \equiv \mu_{\it eff} L_0 \quad (3)$$

The effective permeability $\mu_{\it eff}$ can be given by the following Equation (4).

$$\mu_{\it eff} = \mu_1\left[1 + \left(\frac{\mu_2}{\mu_1} - 1\right)X\right] \quad (4)$$

Therein, $$X \equiv \ln\frac{b}{k} \bigg/ \ln\frac{b}{a}$$

is assumed.

According to this Equation, it can be understood that the effective permeability can be reduced depending on the ratio of the permeability of the inside to the permeability of the outside of the coaxial tube. On the other hand, the capacitance per unit length C' of the coaxial tube can be calculated from the model of thin concentric cylinders connected in series and given by the following Equation.

$$\frac{1}{C'} = \int_a^k \frac{dr}{\varepsilon_0 \varepsilon_1 2\pi r} + \int_k^b \frac{dr}{\varepsilon_0 \varepsilon_2 2\pi r} \quad (5)$$

$$= \frac{1}{2\pi\varepsilon_0\varepsilon_1}\ln\frac{k}{a} + \frac{1}{2\pi\varepsilon_0\varepsilon_2}\ln\frac{b}{k}$$

From the Equation (5), C' is expressed by the following Equation (6).

$$C' = \varepsilon_1 \frac{1}{1 + \left(\frac{\varepsilon_1}{\varepsilon_2} - 1\right)\frac{\ln\frac{b}{k}}{\ln\frac{b}{a}}} C_0 \equiv \varepsilon_{\mathit{eff}} C_0 \quad (6)$$

In the same manner as the inductance, assuming $$C_0 \equiv \frac{2\pi\varepsilon_0}{\ln\frac{b}{a}}$$

the effective permittivity $\varepsilon_{\mathit{eff}}$ can be expressed the following Equation (7).

$$\varepsilon_{\mathit{eff}} = \varepsilon_1 \frac{1}{1 + \left(\frac{\varepsilon_1}{\varepsilon_2} - 1\right)\chi} \quad (7)$$

When the dielectric substance placed outside is thin, the above effective permittivity can be approximated to the following Equation. According to this Equation, it can be understood that the effective permittivity decreases with increases in the thickness of the dielectric substance, and the permittivity of the substance existing inside is larger in the contribution to the effective permittivity, which is different from the case of the permeability.

$$\varepsilon_{\mathit{eff}} \cong \varepsilon_1\left[1 - \left(\frac{\varepsilon_1}{\varepsilon_2} - 1\right)\chi\right]$$

$\mu_1=9$ and $\epsilon_1=90$ are assumed. Further, assuming that the dielectric substance interposed between the magnetic material and the grounding conductor is a paradielectric substance such as plastic, $\mu_2=1$ and $\epsilon_1=2.5$ are assumed. By substituting these data into the Equation (7), changes in the effective permeability $\mu_{\mathit{eff}}$ and the effective permittivity $\epsilon_{\mathit{eff}}$ caused by the insertion of the dielectric substance can be determined as follows.

$$\mu_{\mathit{eff}} = 9(1 - 0.89\chi) \quad (8)$$

$$\mu_{\mathit{eff}} \cong 90(1 - 35\chi) \quad (9)$$

As obvious from the Equations (8) and (9), the effective permittivity $\epsilon_{\mathit{eff}}$ decreases 39.3 times faster than the effective permeability $\mu_{\mathit{eff}}$. Therefore, by interposing a paradielectric substance having a low permittivity between the magnetic material and the grounding conductor, it is possible to reduce the effective permittivity while the change of the effective permeability is being suppressed. Further, even if the insulation of the magnetic material layer is destroyed due to the increased amount of iron fine powder, the inserted dielectric substance can avoid current leakage, thereby providing a structure with increased flexibility in the characteristics.

Figure 37:
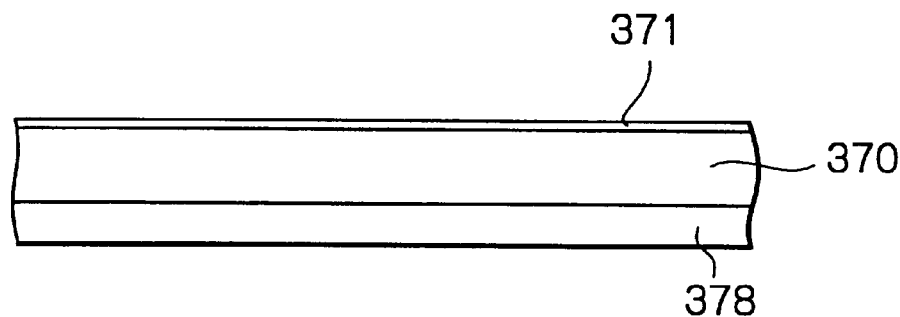
FIG. 37 is a cross sectional diagram of a further other embodiment of the covering sheet according to the invention.

FIG. 37 is a cross sectional diagram of a further other embodiment of the covering sheet according to the invention.

In this figure, reference numeral 378 denotes a dielectric layer, reference numeral 370 denotes a magnetic material layer laminated on the dielectric layer 378, and reference numeral 371 denotes a ground conductor layer laminated on the magnetic material layer 370. The dielectric layer 378 has a permittivity lower than that of the magnetic material layer 370.

The dielectric layer 378 includes a layer of solid dielectric material having a low permittivity or mainly a layer of air. The magnetic material layer 370 is made of a resin compound having an oxide magnetic material or a metal magnetic material mixed therein and having a thickness of about 0.5 mm in the present embodiment. The resin compound includes, for example, a magnetic material made by kneading carbonyl-iron of about 85 wt % into rubber. The ground conductor layer 371 includes copper foil adhered over to the whole surface of the magnetic material layer 370. The modifications of the materials making up each element are the same as in the case of the embodiment of FIG. 33.

Further, the magnetic material layer 370 and/or the dielectric layer 378 may be either of a single layer structure or a multi-layer structure.

Figure 38:
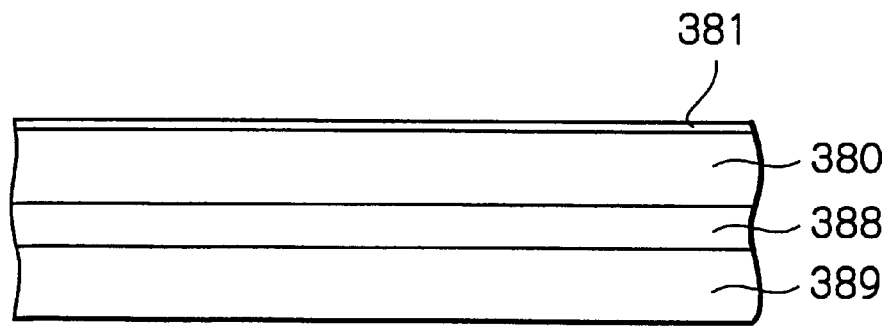
FIG. 38 is a cross sectional diagram of a further other embodiment of the covering sheet according to the invention.

FIG. 38 is a cross sectional diagram of a further other embodiment of the covering sheet according to the invention.

In this figure, reference numeral 389 denotes a first magnetic material layer, reference numeral 388 denotes a dielectric layer laminated on the first magnetic material layer 389, reference numeral 380 denotes a second magnetic material layer laminated on the dielectric substance 388, and reference numeral 381 denotes a ground conductor layer laminated on the second magnetic material layer 380. The dielectric layer 388 has a permittivity lower than that of the first and second magnetic material layers 389 and 380.

The dielectric layer 388 includes a layer of solid dielectric material having a low permittivity or mainly a layer of air. The magnetic material layers 389 and 380 are made of a resin compound having an oxide magnetic materials or a metal magnetic materials mixed therein and having a thickness of about 0.5 mm in the present embodiment. The resin compound includes, for example, a magnetic material made by kneading carbonyl-iron of about 85 wt % into rubber. The ground conductor layer 381 includes copper foil adhered over to the whole surface of the second magnetic material layer 380. The modifications of the materials making up each element are the same as in the case of the embodiment of FIG. 33.

Further, the magnetic material layers 380 and 389 and/or the dielectric layer 388 may be either of a single layer structure or a multi-layer structure.

As a modification of the present embodiment, a covering sheet having the magnetic material layer and/or the dielectric layer further alternately stacked in addition to the above structure also is adaptable to the invention.

Figure 39:
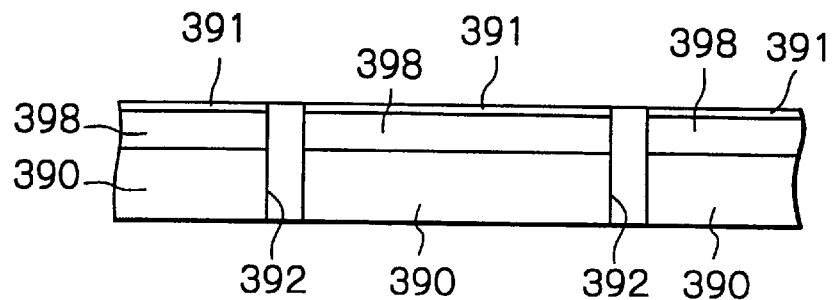
FIG. 39 is a cross sectional diagram of a further other embodiment of the covering sheet according to the invention.

FIG. 39 is a cross sectional diagram of a further other embodiment of the covering sheet according to the invention.

In this figure, reference numeral 390 denotes a magnetic material layer, reference numeral 398 denotes a dielectric layer being laminated on the magnetic material layer 390 and having a permittivity lower than that of the magnetic material layer 390, reference numeral 391 denotes a ground conductor layer laminated on the dielectric layer 398, and reference numeral 392 denotes a plurality of via holes each passing through this covering sheet.

The magnetic material layer 390 is made of a resin compound having an oxide magnetic material or a metal magnetic material mixed therein and having a thickness of about 0.5 mm in the present embodiment. The resin compound includes, for example, a magnetic material made by kneading carbonyl-iron of about 85 wt % into rubber. The dielectric layer 398 includes a layer of solid dielectric material having a low permittivity or mainly a layer of air. The ground conductor layer 391 includes copper foil adhered to the whole surface of the dielectric layer 398. The plurality of via holes 392 are for passing conducting unit for grounding the ground conductor layer 391.

The resin of the magnetic material layer 390 may include silicone rubber or chlorine-based rubber and the like. The oxide magnetic materials of the magnetic material layer 390 may include nickel zinc ferrite, manganese zinc ferrite, and hexagonal ferrite and the like. The metal magnetic materials of the magnetic material layer 390 may include iron silicon, permalloy and the like, in addition to pure-iron fine powder. When the dielectric layer 338 is formed mainly by a layer of air, it has honeycomb construction interposed in the portion of the layer, which honeycomb construction is formed of spacer or paper or plastic. The solid dielectric material layer of the dielectric layer 398 may include silicone rubber, chlorine-based rubber, vinyl chloride, polyethylene, foamed polyethylene, foamed silicone, foamed styrol, foamed teflon and the like. The ground conductor layer 391 may include brass foil, nickel foil and the like, in addition to copper foil.

Further, the magnetic material layer 390 and/or the dielectric layer 398 may be either of a single layer structure or a multi-layer structure.

Figure 40:
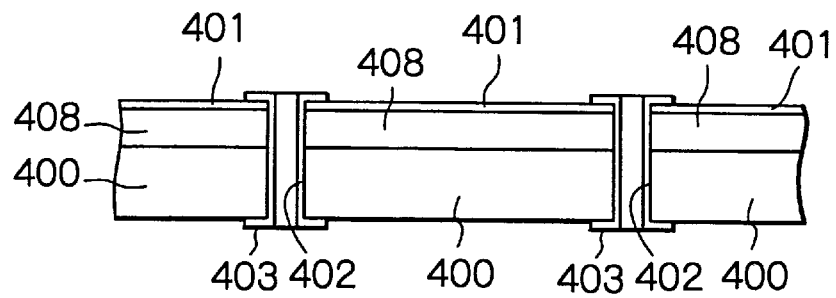
FIG. 40 is a cross sectional diagram of a further other embodiment of the covering sheet according to the invention.

FIG. 40 shows a cross sectional diagram of a further other embodiment of the covering sheet according to the invention.

In this figure, reference numeral 400 denotes a magnetic material layer, reference numeral 408 denotes a dielectric layer being laminated on the magnetic material layer 400 and having a permittivity lower than that of the magnetic material layer 400, reference numeral 401 denotes a ground conductor layer laminated on the dielectric layer 408, reference numeral 402 denotes a plurality of via holes each passing through this covering sheet, and reference numeral 403 is a grounding conductor having one end thereof electrically connected to the ground conductor layer 401 and passing through the via hole 402.

The magnetic material layer 400 is made of a resin compound having an oxide magnetic material or a metal magnetic material mixed therein, and has a thickness of about 0.5 mm in the present embodiment. The resin compound may include, for example, a magnetic material made by kneading carbonyl-iron of about 85 wt % into rubber. The dielectric layer 408 includes a layer of solid dielectric material having a low permittivity or mainly a layer of air. The ground conductor layer 401 includes copper foil adhered over to the whole surface of the dielectric layer 408. The grounding conductor 403 includes a conductor material suitable for soldering, such as copper, brass, and nickel, and it has, for example, a grommet structure in this embodiment. The modifications and the like of materials making up each element are the same as in the case of the embodiment of FIG. 39.

Further, the magnetic material layer 400 and/or the dielectric layer 408 may be either of a single layer structure or a multi-layer structure.

Figure 41:
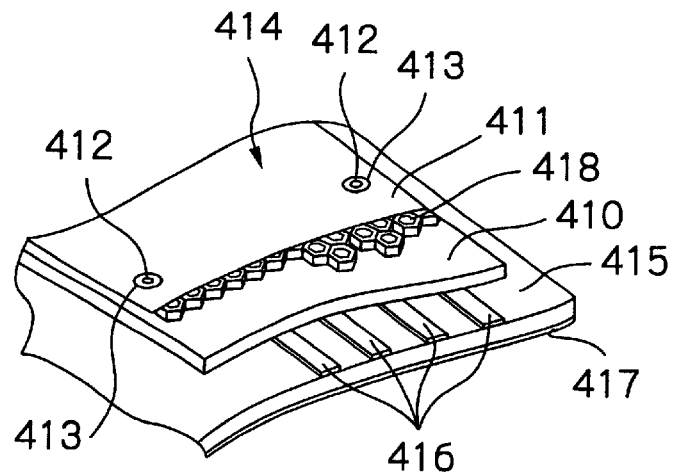
FIG. 41 is a perspective diagram showing a triplate absorbing type of high-cut filter line, in which the top of the bus is covered with the covering sheet having a ground conductor layer, as a further other embodiment of the triplate line according to the invention.

FIG. 41 is a perspective diagram showing the triplate absorbing type of high-cut filter line in which the top of a bus is covered with such a covering sheet, as a further other embodiment of the triplate line according to the invention.

In this figure, reference numeral 414 denotes a covering sheet, which includes a magnetic material layer 410, a dielectric layer 418 laminated on the magnetic material layer 410, a ground conductor layer 411 laminated on the dielectric layer 418, a plurality of via holes 412, and a plurality of grounding conductors 413 having one end thereof electrically connected to the ground conductor layer 411 and passing through the via holes 412, in the same manner as in the case of the embodiment of FIG. 39.

In FIG. 41, further, reference numeral 415 denotes a micro-strip circuit board, on one side of which a signal bus 416 for a computer is formed, and on the other side of which a ground conductor 417 is formed. The covering sheet 414 is applied on the micro-strip circuit board 415 so as to cover the buses 416. In this case, the sheet 414 is applied such that the ground conductor layer 411 of the sheet may face outside. Further, the other end of the grounding conductor 413 is electrically connected to the conducting portion of the ground conductor (not shown) which is formed on the micro-strip circuit board 415, thereby the grounding conductor 411 and the ground conductor 417 being electrically connected.

That is, the invention notes that a usual bus is constructed on a micro-strip circuit board, and covers the top of the bus 416 with the covering sheet 414 such that the ground conductor layer 411 of the sheet may face upward, and electrically connects the ground conductor layer 411 to ground of the bus, thereby constructing a triplate absorbing type of high-cut filter line.

The present embodiment is different only in the covering sheet 414 from the embodiment of FIG. 14, and nearly the same in the constitution, action and effect, modifications and the like as in the case of the embodiment of FIG. 14.

Figure 42:
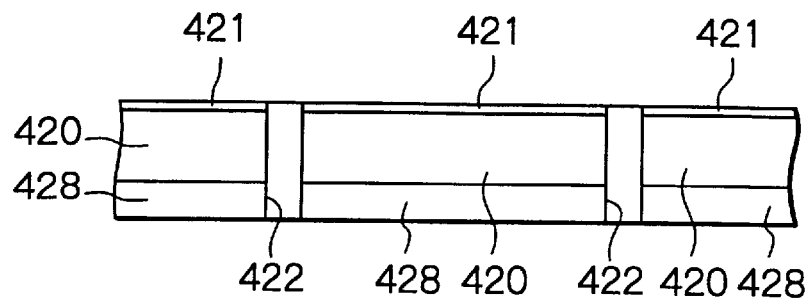
FIG. 42 is a cross sectional diagram of a furthermore other embodiment of the covering sheet according to the invention.

FIG. 42 is a cross sectional diagram of a further other embodiment of the covering sheet according to the invention.

In this figure, reference numeral 428 denotes a dielectric layer, reference numeral 420 denotes a magnetic material layer laminated on the dielectric substance 428, reference numeral 421 denotes a ground conductor layer laminated on the magnetic material layer 420, and reference numeral 422 denotes a plurality of via holes each passing through this covering sheet. The dielectric layer 428 has a permittivity lower than that of the magnetic material layer 420.

The dielectric layer 428 includes a layer of solid dielectric material having a low permittivity or mainly a layer of air. The magnetic material layer 420 is made of a compound resin having an oxide magnetic material or a metal magnetic material mixed therein and having a thickness of about 0.5 m in the present embodiment. The resin compound includes, for example, a magnetic material made by kneading carbonyl-iron of about 85 wt % into rubber. The ground conductor layer 421 includes copper foil adhered over to the whole surface of the magnetic material layer 420. The plurality of via holes 422 are for passing conducting unit for grounding the ground conductor layer 421. The modifications of the materials making up each element are the same as in the case of the embodiment of FIG. 39.

Further, the magnetic material layer 420 and/or the dielectric layer 428 may be either of a single layer structure or a multi-layer structure.

Figure 43:
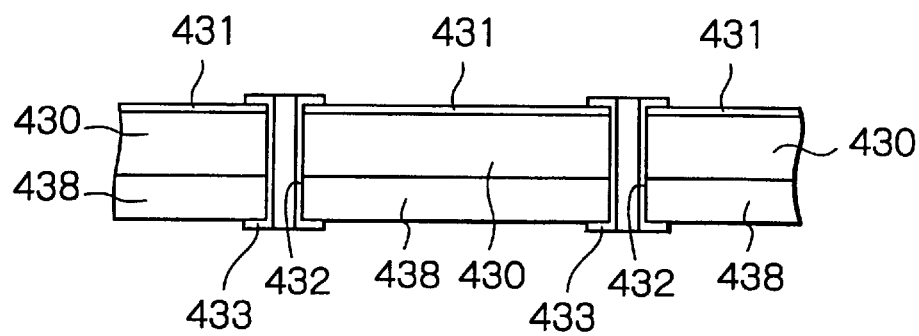
FIG. 43 is a cross sectional diagram of a further other embodiment of the covering sheet according to the invention.

FIG. 43 is a cross sectional diagram of a further other embodiment of the covering sheet according to the invention.

In this figure, reference numeral 438 denotes a dielectric layer, reference numeral 430 denotes a magnetic material layer laminated on the dielectric substance 438, reference numeral 431 denotes a ground conductor layer laminated on the magnetic material layer 430, reference numeral 432 denotes a plurality of via holes each passing through this covering sheet, and reference numeral 433 denotes a grounding conductor having one end thereof electrically connected to the ground conductor layer 431 and passing through the via holes 432. The dielectric layer 438 has a permittivity lower than that of the magnetic material layer 430.

The dielectric layer 438 includes a layer of solid dielectric material having a low permittivity or mainly a layer of air. The magnetic material layer 430 is made of a resin compound having an oxide magnetic material or a metal magnetic material mixed therein and having a thickness of about 0.5 mm in the present embodiment. The resin compound includes, for example, a magnetic material made by kneading carbonyl-iron of about 85 wt % into rubber. The ground conductor layer 431 includes copper foil adhered over to the whole surface of the magnetic material layer 430. The grounding conductor 433 includes a conductor material suitable for soldering, such as copper, brass, and nickel, and it has, for example, a grommet structure in this embodiment. The modifications of the materials making up each element are the same as in the case of the embodiment of FIG. 39.

Further, the magnetic material layer 430 and/or the dielectric layer 438 may be either of a single layer structure or a multi-layer structure.

Figure 44:
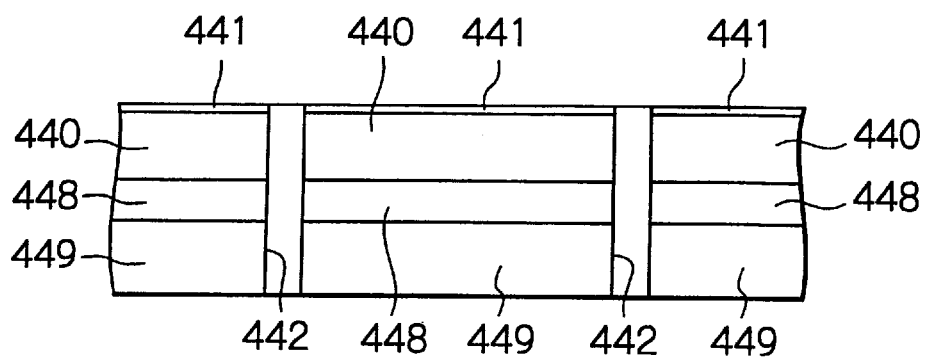
FIG. 44 is a cross sectional diagram of a furthermore other embodiment of the covering sheet according to the invention.

FIG. 44 is a cross sectional diagram of a further other embodiment of the covering sheet according to the invention.

In this figure, reference numeral 449 denotes a first magnetic material layer, reference numeral layer 448 denotes a dielectric layer laminated on the first magnetic material layer 449, reference numeral 440 denotes a second magnetic material layer laminated on the dielectric substance 448, reference numeral 441 denotes a ground conductor layer laminated on the second magnetic material layer 440, and reference numeral 442 denotes a plurality of via holes each passing through this covering sheet. The dielectric layer 448 has a permittivity lower than that of the first and second magnetic material layers 449 and 440.

The dielectric layer 448 includes a layer of solid dielectric material having a low permittivity or mainly a layer of air. The magnetic material layers 449 and 440 are made of a resin compound having an oxide magnetic material or a metal magnetic material mixed therein and having a thickness of about 0.5 mm in the present embodiment. The resin compound includes, for example, a magnetic material made by kneading carbonyl-iron of about 85 wt % into rubber. The ground conductor layer 441 includes copper foil adhered over to the whole surface of the second magnetic material layer 440. The modifications of the materials making up each element are the same as in the case of the embodiment of FIG. 39.

Further, the magnetic material layer 440 and 449 and/or the dielectric layer 448 may be either of a single layer structure or a multi-layer structure.

As a modification of the embodiment, a covering sheet having the magnetic material layer and/or the dielectric layer further stacked alternately in addition to the above structure is adaptable to the invention.

Figure 45:
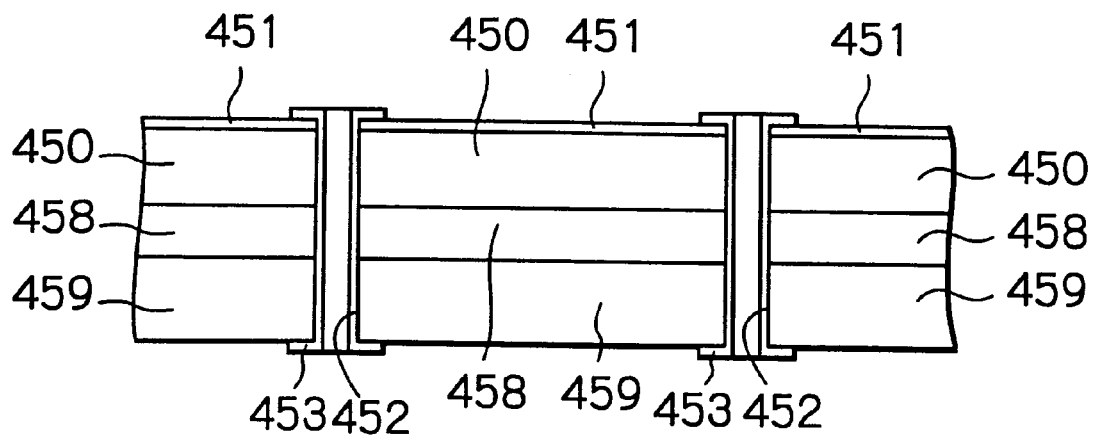
FIG. 45 is a cross sectional diagram of a further other embodiment of the covering sheet according to the invention.

FIG. 45 is a cross sectional diagram of a further other embodiment of the covering sheet according to the invention.

In this figure, reference numeral 459 denotes a first magnetic material layer, reference numeral 458 denotes a dielectric layer laminated on the first magnetic material layer 459, reference numeral 450 denotes a second magnetic material layer laminated on the dielectric substance 458, reference numeral 451 denotes a ground conductor layer laminated on the second magnetic material layer 450, reference numeral 452 denotes a plurality of via holes each passing through this covering sheet, and reference numeral 453 denotes a grounding conductor having one end thereof electrically connected to the ground conductor layer 451 and passing through the via holes 452. The dielectric layer 458 has a permittivity lower than that of the first and second magnetic material layers 459 and 450.

The dielectric layer 458 includes a layer of solid dielectric material having a low permittivity or mainly a layer of air. The magnetic material layers 459 and 450 are made of a resin compound having an oxide magnetic material or a metal magnetic material mixed therein and having a thickness of about 0.5 mm in the present embodiment. The resin compound includes, for example, a magnetic material made by kneading carbonyl-iron of about 85 wt % into rubber. The ground conductor layer 451 includes copper foil adhered over to the whole surface of the second magnetic material layer 450. The grounding conductor 453 includes a conductor material suitable for soldering, such as copper, brass, and nickel, and it has, for example, a grommet structure in this embodiment. The modifications of the materials making up each element are the same as in the case of the embodiment of FIG. 39.

Further, the magnetic material layer 450 and 459 and/or the dielectric layer 458 may be either of a single layer structure or a multi-layer structure.

As a modification of the embodiment, a covering sheet having the magnetic material layer and/or the dielectric layer alternately stacked in addition to the above structure is applicable to the invention.

Figure 46:
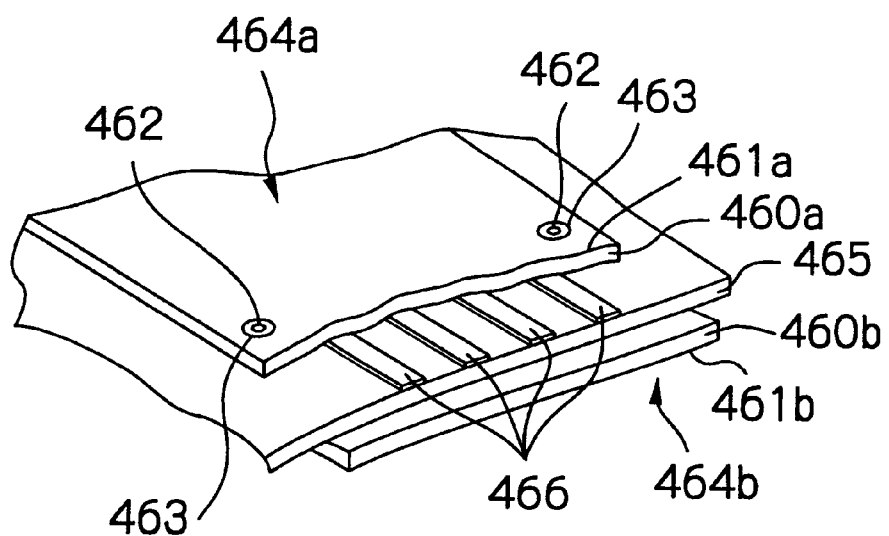
FIG. 46 is a perspective diagram showing a triplate absorbing type of high-cut filter line, in which the upper and lower parts of the signal line are covered with the covering sheet having a ground conductor layer, as a further other embodiment of the triplate line according to the invention.

FIG. 46 is a perspective diagram showing a triplate absorbing type of high-cut filter line in which the top of the usual signal line and the back side of the circuit board are covered with such a covering sheet, as a further other embodiment of the triplate line according to the invention.

In this figure, reference numerals 464a and 464b denote first and second covering sheets respectively, which include magnetic material layers 460a and 460b, ground conductor layers 461a and 461b laminated on the magnetic material layers 460a and 460b, a plurality of via holes 462a each passing through the covering sheet, and a grounding conductor 463a having one end thereof electrically connected to the ground conductor layers 461a and 461b and passing through the via holes 462a, in the same manner as in the case of the embodiment of FIG. 13.

In FIG. 46, further, reference numeral 465 denotes a circuit board, on one side of which a usual signal line 466 is formed, and on the other side of which a ground conductor is not formed. The first and second covering sheets 464a and 464b are applied over the upper side and back side of the circuit board 465 so as to cover the line 466. In this case, the sheet 464a and 464b are applied such that the ground conductor layers 461a and 461b of the respective sheets may face outside. Further, the ground conductor layers 461a and 461b of the sheets 464a and 464b are electrically connected to the ground conductor of the circuit board via conducting unit (not shown).

That is, in usual electronic equipment, lines are not always formed in micro-strip lines, but sometimes signal lines are only placed on circuit boards. Therefore, according to the embodiment, the lines are sandwiched between the covering sheets in such a manner that the ground conductor layer of each covering sheet may be positioned outside, and the ground conductor layers are connected to the ground terminal of the circuit board, thereby the triplate absorbing type of high-cut filter line being formed.

Figure 47:
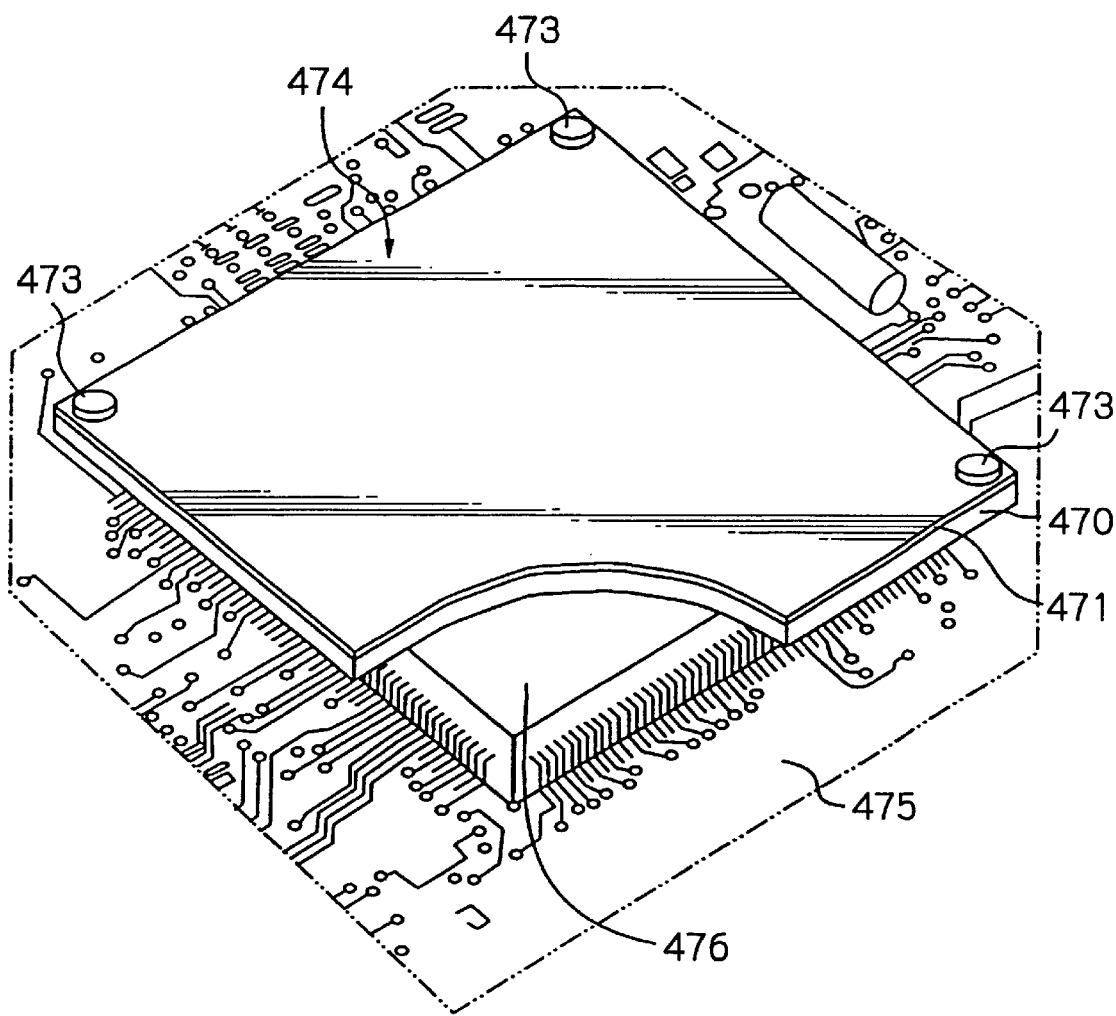
FIG. 47 is a perspective diagram showing a covering structure of an electronic circuit in which the top of a LSI is covered with the covering sheet having a ground conductor layer, as other embodiment of the invention.

FIG. 47 is a perspective diagram showing a covering structure of electronic circuits in which the top of a LSI is covered with the covering sheet having a ground conductor layer as a further other embodiment of the present invention.

In this figure, reference numeral 474 denotes the covering sheet, which includes a magnetic material layer 470, a ground conductor layer 471 laminated on the magnetic material layer 470, and a plurality of grounding conductors 473 having one end thereof connected to the ground conductor layer 471 and passing through via holes, in the same manner as in the case of the embodiment of FIG. 13.

In FIG. 47, further, reference numeral 475 denotes a micro-strip circuit board for a computer, on one side of which a LSI 476 is mounted, and on the other side of which a ground conductor 477 is formed. The covering sheet 474 has larger dimensions than the LSI 476 and is applied over the circuit board 475 so as to cover the LSI 476. In this case, the sheet 474 is applied such that the ground conductor layer 471 of the sheet may face outside. Further, the other end of the grounding conductor 473 is electrically connected to the conducting portion of the ground conductor (not shown) which is formed on the circuit board 475, thereby the grounding conductor 471 and the ground conductor (not shown) being electrically connected.

That is, the invention notes that the LSI 476 is mounted on a micro-strip circuit board, and covers the top of the LSI 476 with the covering sheet 474 such that the ground conductor layer 471 of the sheet may be positioned up, and electrically connect the ground conductor layer 471 to ground of the circuit board, thereby constructing the triplate absorbing type of high frequency cut-off structure.

The present embodiment is different from the embodiment of FIG. 14 only in that the target to be coated with the covering sheet 474 is a LSI of an example of electronic circuits, and is nearly the same in the other points, such as constitution, action and effect, and modifications, as in the case of the embodiment of FIG. 14. That is, radiation sources of noises are not limited to signal lines but include integrated circuits itself. The LSI 476 is covered with the covering sheet 474 having larger dimensions than the dimensions of the LSI, and then the ground conductor layer 471 of the sheet is connected to the ground conductor of the circuit board via the grounding conductor 473, thereby permitting the suppression of noises directly radiated from the LSI.

Many widely different embodiments of the present invention may be constructed without departing from the spirit and scope of the present invention. It should be understood that the present invention is not limited to the specific embodiments described in the specification, except as defined in the appended claims.

What is claimed is:

1. A covering sheet comprising:
   at least one magnetic material layer made of a resin compound having an oxide magnetic material or a metal magnetic material mixed therein;
   a ground conductor layer laminated on one surface of said magnetic material layer, one surface of said ground conductor layer being exposed to a free space; and
   a plurality of via holes for passing conducting means for grounding said ground conductor layer to a ground path of a signal bus covered by the covering sheet,
   said ground conductor layer, said signal bus and said ground path forming a triplate line structure.

2. The covering sheet as claimed in claim 1, wherein said sheet further comprises a plurality of conducting means, electrically connected to said ground conductor layer through said plurality of via holes, for grounding said ground conductor layer.

3. A covering sheet comprising:
   a laminate consisting of at least one magnetic material layer made of a resin compound having an oxide magnetic material or a metal magnetic material mixed therein and at least one dielectric layer having a permittivity lower than that of said magnetic material layer;
   a ground conductor layer laminated on one surface of said laminate, one surface of said ground conductor layer being exposed to a free space; and
   a plurality of via holes for passing conducting means for grounding said ground conductor layer to a ground path of a signal bus covered by the covering sheet,
   said ground conductor layer, said signal bus and said ground path forming a triplate line structure.

4. The sheet as claimed in claim 3, wherein said dielectric layer is adjacent to said ground conductor layer.

5. The sheet as claimed in claim 3, wherein said magnetic material layer is adjacent to said ground conductor layer.

6. The sheet as claimed in claim 3, wherein said dielectric layer is a layer of solid dielectric material.

7. The sheet as claimed in claim 3, wherein said dielectric layer is mainly a layer of air.

8. A triplate line bus including an insulator circuit board, a micro-strip line formed on one surface of said insulator circuit board, a ground conductor formed on the other surface of said insulator circuit board, and a covering sheet covering said micro-strip line with a ground conductor positioned outside,
   said covering sheet comprising at least one magnetic material layer made of a resin compound having an oxide magnetic material or a metal magnetic material mixed therein, a ground conductor layer laminated on one surface of said magnetic material layer, one surface of said ground conductor layer being exposed to a free space, and a plurality of via holes for passing conducting means for grounding said ground conductor layer, said ground conductor being electrically connected to said ground conductor,
   said ground conductor layer, said micro-strip line and said ground conductor forming a triplate line structure.

9. A signal bus for a computer having a triplate line structure, including an insulator circuit board, a micro-strip line formed on one surface of said insulator circuit board, a ground conductor formed on the other surface of said insulator circuit board, and a covering sheet applied on said micro-strip line with said ground conductor positioned outside,
   said covering sheet comprising at least one magnetic material layer made of a resin compound having an oxide magnetic material or a metal magnetic material mixed therein, a ground conductor layer laminated on one surface of said magnetic material layer, one surface of said ground conductor layer being exposed to a free space, and a plurality of via holes for passing conducting means for grounding said ground conductor layer to said ground conductor,
   said ground conductor layer, said micro-strip line and said ground conductor forming a triplate line structure.

10. A covering sheet comprising:
    a magnetic material layer made of a resin compound having an oxide magnetic material or a metal magnetic material mixed therein;
    a dielectric layer being laminated on said magnetic material layer with one surface of the dielectric layer adjacent to said magnetic material layer and having a permittivity lower than that of said magnetic material layer; and a ground conductor layer laminated on the other side of said dielectric layer;

one surface of said ground conductor layer being exposed to a free space; and a plurality of via holes for passing conducting means for grounding said ground conductor layer to a ground path of a signal bus covered by the covering sheet, said ground conductor layer, said signal bus and said ground path forming a triplate line structure.

11. The sheet as claimed in claim 10, wherein said dielectric layer is a layer of solid dielectric material.

12. The sheet as claimed in claim 10, wherein said dielectric layer is mainly a layer of air.

13. A triplate line bus including an insulator circuit board, a micro-strip line formed on one surface of said insulator circuit board, a first covering sheet covering said micro-strip line, and a second covering sheet covering the other surface of said insulator circuit board, said first or second covering sheet comprising a laminate consisting of at least one magnetic material layer made of a resin compound having an oxide magnetic material or a metal magnetic material mixed therein and at least one dielectric layer having a permittivity lower than that of said magnetic material layer, and a ground conductor layer laminated on one surface of said laminate, one surface of said ground conductor layer being exposed to a free space, said ground conductor layers of said first and second covering sheets being electrically connected to a ground conductor of said insulator circuit boards, said ground conductor layer, said micro-strip line and said ground conductor forming a triplate line structure.

14. The triplate line bus as claimed in claim 13, wherein said ground conductor layers are connected to said ground conductor at a plurality of points.

15. The triplate line bus as claimed in claim 13, wherein said ground conductor layers are electrically connected to said ground conductor via a plurality of via holes passing through said sheet.

16. A covering structure of electronic circuits, including an insulator circuit board, an electronic circuit formed on one surface of said insulator circuit board, a ground conductor formed on the other surface of said insulator circuit board, and a covering sheet covering said electronic circuit, said covering sheet comprising a laminate consisting of at least one magnetic material layer made of a resin compound having an oxide magnetic material or a metal magnetic material mixed therein and at least one dielectric layer having a permittivity lower than that of said magnetic material layer, and a ground conductor layer laminated on one surface of said laminate, one surface of said ground conductor layer being exposed to a free space, said ground conductor layer being electrically connected to said ground conductor, said ground conductor layer, said electronic circuit and said ground path forming a triplate line structure.

17. The structure as claimed in claim 16, wherein said ground conductor layer is connected to said ground conductor at a plurality of points.

18. The structure as claimed in claim 16, wherein said ground conductor layer is electrically connected to said ground conductor via a plurality of via holes passing through said sheet.

19. A triplate line bus including an insulator circuit board, a micro-strip line formed on one surface of said insulator circuit board, a ground conductor formed on the other surface of said insulator circuit board, and a covering sheet covering said micro-strip line with said ground conductor positioned outside, said covering sheet comprising a laminate consisting of at least one magnetic material layer made of a resin compound having an oxide magnetic material or a metal magnetic material mixed therein and at least one dielectric layer having a permittivity lower than that of said magnetic material layer, and a ground conductor layer laminated on one surface of said laminate, one surface of said ground conductor layer being exposed to a free space, said ground conductor layer being electrically connected to said ground conductor, said ground conductor layer, said micro-strip line and said ground conductor forming a triplate line structure.

20. The triplate line bus as claimed in claim 19, wherein said ground conductor layer is electrically connected to said ground conductor via a plurality of via holes passing through said sheet.

21. The triplate line bus as claimed in claim 19, wherein said ground conductor layer is connected to said ground conductor at a plurality of points.

22. A triplate line bus including an insulator circuit board, a micro-strip line formed on one surface of said insulator circuit board, a first covering sheet covering said micro-strip line, and a second covering sheet covering the other surface of said insulator circuit board, said first or second covering sheet comprising at least one magnetic material layer made of a resin compound having an oxide magnetic material or a metal magnetic material mixed therein, a ground conductor layer laminated on one surface of said magnetic material layer, one surface of said ground conductor layer being exposed to a free space, and a plurality of via holes for passing conducting means for grounding said ground conductor layer to a ground conductor of said insulator circuit board, said ground conductor layer, said micro-strip line and said ground conductor forming a triplate line structure.

* * * * *